US009368938B2

(12) United States Patent
Terashima et al.

(10) Patent No.: US 9,368,938 B2
(45) Date of Patent: Jun. 14, 2016

(54) NITRIDE SEMICONDUCTOR QUANTUM CASCADE LASER

(71) Applicant: RIKEN, Wako-shi (JP)

(72) Inventors: Wataru Terashima, Wako (JP); Hideki Hirayama, Wako (JP)

(73) Assignee: RIKEN, Saitama (JP)

( * ) Notice: Subject to any disclaimer, the term of this patent is extended or adjusted under 35 U.S.C. 154(b) by 0 days.

(21) Appl. No.: 14/823,686

(22) Filed: Aug. 11, 2015

(65) Prior Publication Data

US 2016/0064901 A1    Mar. 3, 2016

(30) Foreign Application Priority Data

Aug. 14, 2014   (JP) .................................. 2014-165222
Jul. 28, 2015   (JP) .................................. 2015-148786

(51) Int. Cl.
| H01S 5/34 | (2006.01) |
| H01S 5/343 | (2006.01) |
| H01S 5/02 | (2006.01) |
| H01S 5/042 | (2006.01) |
| H01S 5/20 | (2006.01) |

(52) U.S. Cl.
CPC .............. *H01S 5/3402* (2013.01); *H01S 5/0213* (2013.01); *H01S 5/042* (2013.01); *H01S 5/2054* (2013.01); *H01S 5/3407* (2013.01); *H01S 5/34333* (2013.01); *H01S 2301/02* (2013.01)

(58) Field of Classification Search
CPC ..... H01S 5/3402; H01S 5/042; H01S 5/3407; H01S 5/2054; H01S 5/0213
See application file for complete search history.

(56) References Cited

U.S. PATENT DOCUMENTS

| 6,324,199 B1 * | 11/2001 | Capasso ................. B82Y 20/00 |
| | | 372/45.01 |
| 9,001,858 B1 * | 4/2015 | Hirayama ............. H01S 5/3425 |
| | | 372/45.012 |

FOREIGN PATENT DOCUMENTS

JP          2013/171842 A          2/2013

OTHER PUBLICATIONS

W. Terashima and H. Hirayama, "Design and fabrication of terahertz quantum cascade laser structure based on III-nitride semiconductors," Phys. Status Solidi, Wiley-VCH Verlag GmbH & Co. KGaA, Weinheim (2009) C 6, No. S2, pp. S615-S618, 5 pages.

W. Terashima and H. Hirayama, "Spontaneous emission from GaN/AlGaN terahertz quantum cascade laser grown on GaN substrate," Phys. Status Solidi, Wiley-VCH Verlag GmbH & Co. KGaA, Weinheim (2011) C 8, No. 7-8 pp. 2302-2304, 4 pages.

(Continued)

*Primary Examiner* — Dung Nguyen
(74) *Attorney, Agent, or Firm* — Seed IP Law Group PLLC

(57) ABSTRACT

A terahertz quantum cascade laser (THz-QCL) element operable at an unexplored frequency is obtained. A crystal of a nitride semiconductor is used to fabricate a repeated set of unit structures into a super lattice. Each unit structure includes a first barrier layer, a first well layer, a second barrier layer, and a second well layer disposed in this order. An energy level structure for electrons under a bias electric field has a mediation level, an upper lasing level, and a lower lasing level. The energy value of the mediation level is close to the energy value of either an upper lasing level or a lower lasing level, each belonging to either the unit structure or the other unit structure adjacent thereto, and is separated from the energy value of the other level by at least the energy value of a longitudinal-optical (LO) phonon exhibited by the crystal.

23 Claims, 53 Drawing Sheets

(56) References Cited

OTHER PUBLICATIONS

W. Terashima and H. Hirayama, "Development of Terahertz Quantum Cascade Laser Based on III-Nitride Semiconductors ," The Review of Laser Engineering, The Laser Society of Japan (2011) 39 (10), pp. 769-774, 7 pages.

W. Terashima and H. Hirayama, "The Utility of Droplet Elimination by Thermal Annealing Technique for Fabrication of GaN/AlGaN Terahertz Quantum Cascade Structure by Radio Frequency Molecular Beam Epitaxy," Appl. Phys. Express 3, The JapanS of Applied Physics (2010) pp. 125501-1-1225013, 4 pages.

S. Kumar et al., "Two-well terahertz quantum-cascade laser with direct intrawell-phonon depopulation," Applied Physics Letters, American Institute of Physics (2009) 95, 141110-1-14110-3, 3 pages.

Yasuda, H. et al., "Designs of GaN-Based Terahertz Quantum Cascade Lasers for Higher Temperature Operations", Lasers and Electro-Optics (CLEO), 2012 Conference on, IEEE, May 6, 2012, pp. 1-2.

Wacker, A., "Extraction-controlled quantum cascade lasers", Applied Physics Letters, American Institute of Physics, 2 Huntington Quadrangle, Melville, NY 11747, 97:8, Aug. 24, 2010.

Hirayama, H. et al., "Recent progress toward realizing GaN-based THz quantum cascade laser", Proceedings of SPIE, SPIE-International Society for Optical Engineering, US, 8933, Dec. 18, 2013, pp. 89930G-1-89930G-9.

Terashima, W. et al., "GaN-based terahertz quantum cascade lasers", Proceedings of SPIE, SPIE-International Society for Optical Engineering, US, vol. 9848, May 13, 2015 8933, Dec. 18, 2013, pp. 948304-1-948304-8.

Partial European Search Report dated Feb. 1, 2016.

* cited by examiner

NITRIDE SEMICONDUCTOR QUANTUM CASCADE LASER

BACKGROUND

1. Technical Field

The present disclosure relates to a semiconductor quantum cascade lasers. More specifically, the present disclosure relates to a nitride semiconductor quantum cascade laser that includes a gallium nitride based material.

2. Description of the Related Art

Recently, for solid-state lasers operating in wavelength ranges in which electromagnetic wave radiation by inter-band transition is difficult, quantum cascade lasers (QCLs) that utilize inter-subsub band transition of conduction carriers without jumping across a band gap are regarded as promising. QCLs are expected to be put into practical use due to their properties, such as ultra-compactness, high efficiency/high output power, narrow linewidth, long life, continuous wave operation, inexpensiveness, and high durability; and the development of QCLs has been in progress for mid-infrared and terahertz frequency ranges. In particular, when terahertz quantum cascade lasers (THz-QCLs) capable of lasing in a terahertz frequency range of 0.1 THz to 30 THz are realized, the THz-QCLs are expected to be applied to such fields as medical imaging, security check, and high-speed wireless communication. However, lasing operation of THz-QCLs has only been reported in a frequency range of 1.2 to 5.2 THz or a range over 12 THz. That is, lasing operations in a frequency range close to 1 THz, or in a frequency range between 5.2 THz and 12 THz has never been reported. It is an important issue to realize a THz-QCL capable of lasing in such frequency ranges, or in the unexplored frequency ranges.

For conventional materials of THz-QCLs, GaAs-, InP-, and InSb-based semiconductors have been employed. However, even when these materials are employed, it is difficult to realize a THz-QCL of frequency range of 5 to 12 THz. This is because, energy bands of scattering through Froehlich interaction between electrons and longitudinal-optical (LO) phonons for these materials have an overlap with a frequency range of 5 to 12 THz. For example, the LO-phonon energy $E_{LO}$ for GaAs is 36 meV, which is equivalent to 9 THz. In addition, population inversion is degraded due to the fact that refilling lower lasing level with electrons, called thermal backfilling, is likely to occur with GaAs-, InP-, and InSb-based semiconductors, which is also disadvantageous to lasing operation.

It is expected that employing a nitride semiconductor, in place of the above-mentioned conventional materials such as GaAs, allows a THz-QCL of a frequency range of 5 to 12 THz to be realized. With a GaN-based material, which is a typical one of the nitride semiconductors, the LO-phonon energy $E_{LO}$ is 90 meV, namely, about three times higher than that of GaAs. Because of the high LO-phonon energy, the phonon domain shifts to near 22 THz, which is equivalent to the energy of the LO-phonon, enabling the prevention of absorption due to electron-LO-phonon scattering in a frequency range of 5 to 12 THz. Furthermore, a higher energy of electron-LO-phonon scattering is advantageous also in that operation at high temperature can be expected.

It is noted that a theoretical calculation result is disclosed in the case that a super lattice having two well layers of GaN and two barrier layers of AlGaN in each unit corresponding to one period is adopted (see for example, Patent Literature 1, claim 2 therein). However, when a crystal lattice is grown on a polarized surface, which is important in terms of crystal growth, it is shown that a gain takes on negative values at energies corresponding to frequencies of 5 THz or above, or about 20 meV or more. Therefore, lasing operation at frequencies over 5 THz cannot be expected (see for example, Patent Literature 1, FIG. 17). In addition, in this disclosure, actual operation is not predicted specifically. For example, lasing frequencies to be operated are not identified.

BRIEF SUMMARY

The present inventors have attempted, from both of theoretical and experimental perspectives, demonstration of a THz-QCL for which a nitride semiconductor material is employed. One of the objects is to fabricate a THz-QCL that performs lasing operation at any one of frequencies ranging from 5 to 12 THz, which is one of the above-mentioned unexplored frequency ranges. The present inventors have fabricated a structure having four well layers per unit using a GaN-based material ("a four quantum well structure", see Non Patent Literature 1), and furthermore have confirmed that light emission, or radiation, took place due to inter-subsub band transition in such a THz-QCL employing a GaN-based material to which the four quantum well structure is fabricated (Non Patent Literature 2).

However, a THz-QCL has not been necessarily realized as intended (see Non Patent Literature 1 and Non Patent Literature 3). First, the radiation was obtained for 1.4 to 2.8 THz, rather than for a frequency of 7.6 THz which was target one by design. Second, the observed light emission was not of stimulated emission operation in a reproducible manner (lasing operation of the laser); rather what was observed was merely a spontaneous emission operation.

In order to solve the above problems, the present inventors conducted detailed analysis of actual operation for the THz-QCL with a GaN-based material adopting the four quantum well structure by comparing the operation with one in theoretical calculation. The analysis showed that the radiation at the above unexpected frequencies resulted from spontaneous emission of transition between a pair of levels whose energy values were expected to be degenerated. It was confirmed that the pair of levels in the actual crystal lattice were in non-degenerate states, or their degeneracy was lifted, and the radiation occurred at a frequency corresponding to a resulted slight energy difference.

The present disclosure has an object to solve at least one of the above-mentioned problems. That is, the present disclosure is to provide a THz-QCL that performs lasing operation in the unexplored frequency range, thereby contributing to the expansion of the frequency range of THz-QCLs.

Based on the above-mentioned analysis, the present inventors have envisioned that the unintended radiation in a four quantum well structure should be originated from a complex configuration itself, in which a variety of well layers are contained in a single unit structure, in the case where the four quantum well structure is formed on a polarized plane of a substrate. In addition, the inventors have paid attention to each level of a pair of levels that provokes spontaneous emission. Then, based on the specific structure of the pair of levels that actually contributes to the above spontaneous emission, we have attempted to design a new sub band structure. Moreover, we have fabricated a THz-QCL having such a structure, and have confirmed that lasing operation has been actually realized.

That is, in one aspect of the present disclosure, there is provided a quantum cascade laser element including a super lattice formed by a crystal of a nitride semiconductor, wherein the super lattice includes a plurality of unit structures, wherein each unit structure is formed to include a first barrier layer, a first well layer, a second barrier layer, and a second well layer disposed in this order, by repeatedly stacking a barrier layer and a well layer respectively having high and low potentials with respect to conduction-band electrons, wherein, in each unit structure, an energy level structure for electrons under a bias electric field in a stacking direction due to external voltage has: a mediation level that has a significant probability of finding an electron in at least one of the first well layer and the second well layer; an upper lasing level that has a significant probability of finding an electron in the first well layer; and a lower lasing level that has a significant probability of finding an electron in the second well layer, wherein under the bias electric field, an energy value of the mediation level is close to an energy value of one of levels, out of an upper lasing level and a lower lasing level each belonging to any one of the unit structure and another unit structure adjacent thereto, and is separated from an energy value of the other level by at least an energy value of a longitudinal-optical (LO) phonon of the crystal of the nitride semiconductor making the super lattice, and wherein the energy value of the LO-phonon of the nitride semiconductor making the super lattice is greater than a photon energy for an electromagnetic wave to be emitted by stimulated emission from an electron that makes a transition from the upper lasing level to the lower lasing level under the bias electric field.

Additionally, we have found that adopting an additional level may facilitate lasing operation between levels in the above-mentioned sub band structure.

That is, in another aspect of the present disclosure, there is provided a quantum cascade laser element including a super lattice formed by a crystal of a nitride semiconductor, wherein the super lattice includes a plurality of unit structures, wherein each unit structure is formed to include a first barrier layer, a first well layer, a second barrier layer, a second well layer, a third barrier layer, and a third well layer disposed in this order, by repeatedly stacking a barrier layer and a well layer respectively having high and low potentials with respect to conduction-band electrons, wherein, in each unit structure, an energy level structure for electrons under a bias electric field in a stacking direction due to external voltage has: a transport level that has a significant probability of finding an electron in the first well layer; an upper lasing level that has a significant probability of finding an electron existence in the second well layer, the upper lasing level having an energy value lower than the transport level by at least an energy value of a longitudinal-optical (LO) phonon of the crystal of the nitride semiconductor making the super lattice; a lower lasing level that has a significant probability of finding an electron in the third well layer; and a depopulation level that has a significant probability of finding an electron in the third well layer, the depopulation level having an energy value lower than an energy value of the lower lasing level by at least an energy value of the LO-phonon, wherein the energy value of the LO-phonon of the nitride semiconductor making the super lattice is greater than a photon energy for an electromagnetic wave.

Furthermore, in another aspect of the present disclosure, there is provided a quantum cascade laser element including a super lattice formed by a crystal of a nitride semiconductor, wherein the super lattice includes a plurality of unit structures, each unit structure is formed to include a first barrier layer, a first well layer, a second barrier layer, a second well layer, a third barrier layer, and a third well layer disposed in this order by repeatedly stacking a barrier layer and a well layer respectively having high and low potentials with respect to conduction-band electrons, wherein, in each unit structure, an energy level structure for electrons under a bias electric field in a stacking direction due to external voltage has: a transport level that has a significant probability of finding an electron in the first well layer; an injection level that has a significant probability of finding an electron in the second well layer; an upper lasing level that has a significant probability of finding an electron in the second well layer, the upper lasing level having an energy value lower than the injection level by at least an energy value of a longitudinal-optical (LO) phonon that is exhibited by the crystal of the nitride semiconductor making the super lattice; a lower lasing level a significant probability of finding an electron in the third well layer; and a depopulation level that has a significant probability of finding an electron in the third well layer, the depopulation level having an energy value lower than the lower lasing level by at least an energy value of the LO-phonon, wherein the energy value of the LO-phonon of the nitride semiconductor making the super lattice is greater than the photon energy for an electromagnetic wave.

In the present application, an electromagnetic wave in a THz range may refer to an electromagnetic wave in a frequency range of about 0.1 THz to 30 THz, namely, in a wavelength range of about 10 μm to 3 mm. In addition, the unexplored frequency range may be a frequency range of electromagnetic wave of over 5.2 THz and 12 THz or under. The unexplored frequency range may be often roughly described herein as 5 to 12 THz. Furthermore, element structures or functions in the present application may be described by using technical terms converted or borrowed from those technological fields of electronic devices and physics that are related to visible lights or infrared rays. For this reason, even when electromagnetic waves at a frequency or wavelength range far different from those for the visible light are concerned, such terms as "laser", "light emission", or such prefixes as "optical-" or "photo-" may be adopted.

In one aspect of the present disclosure, a quantum cascade laser element that radiates electromagnetic waves at 5 to 12 THz is provided.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale.

DETAILED DESCRIPTION

Hereinafter, Embodiments 1 to 3 of a THz-QCL according to the present disclosure will be described. To describe the Embodiments, there will be described details about the development of the THz-QCL made by the present inventors, Embodiments 1 to 3 of the present disclosure will be next described in detail, and lastly, our acquired knowledge will be supplemented with.

In the following description, certain specific details are set forth in order to provide a thorough understanding of various aspects of the disclosed subject matter. However, the disclosed subject matter may be practiced without these specific details. In some instances, well-known structures and methods comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Specific embodiments are described herein with reference to quantum cascade lasers that have been produced; however, the present disclosure and the reference to certain characteristics of such tools, and the details and ordering of processing steps, are exemplary and should not be limited to those shown.

1. Details about Development of THz-QCL 1-1. Choice of GaN-based Material

Figure 1:
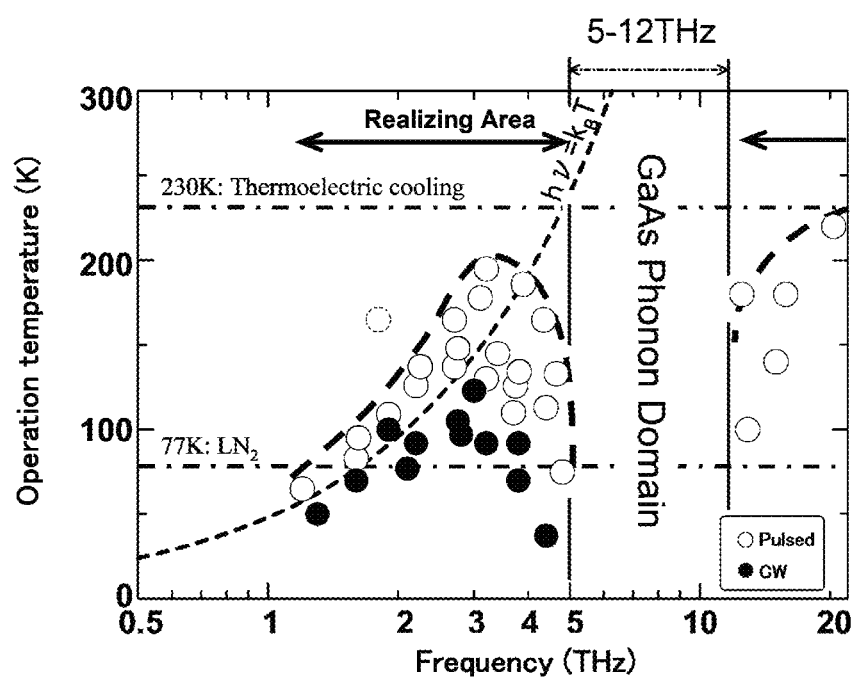
FIG. 1 is a graph showing lasing operations of various conventional THz-QCLs, as a function of lasing frequency and operation temperature.

For conventional THz-QCLs, GaAs-, InP-, and InSb-based semiconductors have been employed. With these materials, the energy band of electron-LO-phonon scattering overlaps with a frequency range of 5 to 12 THz. For example, LO-phonon energy $E_{LO}$ for GaAs is 36 meV, which is equivalent to 9 THz. For this reason, lasing operation has never been realized in the frequency range of 5 to 12 THz; therefore, this is a frequency range within which no lasing has been reported (unexplored frequency range) (FIG. 1).

Figure 2A:
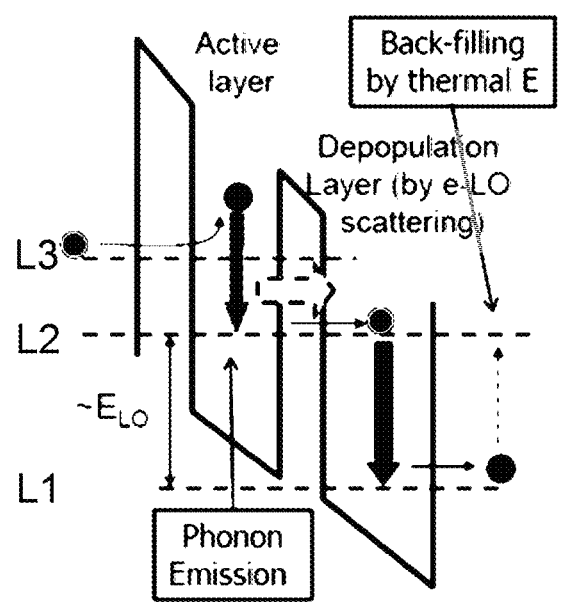
FIG. 2A is a schematic diagram of electron energy illustrating a phenomenon relevant to temperature that has an influence on operation temperature and lasing frequencies in a THz-QCL, in real space along a stacking direction.
Figure 2B:
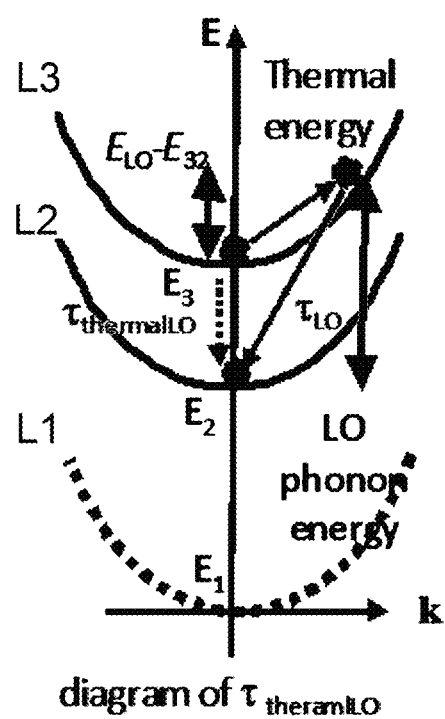
FIG. 2B is a schematic diagram of electron energy illustrating a phenomenon relevant to temperature that has an influence on operation temperature and lasing frequencies in a THz-QCL, in an in-plane wave number space.

To overcome this limitation, it is effective to adopt nitride semiconductors having a high LO-phonon energy $E_{LO}$ when fabricating a THz-QCL; or to be more specific, it is effective to adopt a GaN whose $E_{LO}$ is about 90 meV, or materials containing GaN as its main component (GaN-based material). GaN-based material causes a frequency range where LO-phonons have influence, or phonon domain, to shift toward high-frequency side as compared with a GaAs. Furthermore, GaN-based material is effective also in raising the possibility of lasing at higher temperature. FIGS. 2A, 2B shows schematic diagrams of electron energy for illustrating a phenomenon relevant to temperature that influences on operation temperatures and lasing frequencies in a THz-QCL and for a super lattice of a THz-QCL fabricated by stacking layers spreading over a certain area, for a real space in a stacking direction (FIG. 2A), and for an in-plane wave number space (FIG. 2B). FIG. 2A is drawn by plotting values at the origin of the horizontal axis of FIG. 2B (wave number=0), namely, the lowest values of energy for respective sub bands, on the real space in the stacking direction. In the THz-QCL, a bias electric field created by an external voltage is applied to a super lattice along a stacking direction, where the super lattice has repeatedly stacked well layers and barrier layers that provide different conduction-band potentials to electrons. Under the influence of this, the energy potential of electrons being operating particles has an overall gradient while projecting upward and downward. Electrons are transported in a direction flowing down this gradient while losing their energy.

By focusing on energy aspect, such electron transport may be illustrated as cascade-like transport action with repetition, in which repetition there is found transportation with substantially unchanged energy in an energy level (sub band) bound to potential well layers and transition with drop of energy between sub bands that have discrete energy levels. Involved sub bands include upper and lower levels (an upper lasing level and a lower lasing level in stimulated emission of lasing operation, or levels L3 and L2 in FIGS. 2A, 2B), as well as an additional level L1. As shown in FIG. 2A, an electron emits an electromagnetic wave when making a transition from the level L3 to the level L2. For this reason, it is necessary to realize population inversion that is indispensable in lasing between the levels of the levels L3 and L2. The population inversion can be realized if the level L1 makes electrons' population of level L2 smaller than the population of the level L3.

Temperature has an influence on actual operation of a THz-QCL. If population inversion cannot be maintained, lasing becomes difficult to be performed, and thus the influence of temperature on population inversion becomes a problem. From the perspective of the influence on population inversion, the influence of temperature is that, first, electrons that obtain energies of $E_2+E_{LO}$ or more due to thermal motion in the level L3 may relax to the level L2, which relax is a non-radioactive transition. Second, temperature has an influence by way of a thermal backfilling phenomenon in which electrons are excited again from the level L1 to the level L2 by LO-phonons. These influences of temperature become more serious as temperature increases, whereas all of these influences have properties of being reduced when LO-phonon energy itself increases.

That is, in the case of making use of LO-phonons to form population inversion, increasing LO-phonon energy has properties of promoting the operation at higher temperature. More specifically, LO-phonons are utilized for population inversion in one or both of the operation of injecting electrons from the level L3 to the level L1, an upper lasing level, and the operation of depopulating electrons from the level L2, a lower lasing level. The relationship in this case between temperature and LO-phonons is described by an expression, using a transition rate from the level L3 to the level L1 ($1/\tau_{31}$), and a transition rate from the level L2 to the other levels ($1/\tau_2$).

$$1/\tau_{31}, 1/\tau_2 \propto \frac{1}{e^{\hbar\omega_{LO}/k_B T_{lattice}} - 1} + 1 \quad (1)$$

Here, the symbol ∝ denotes that both sides in the expression across the symbol are in a linear proportional relationship. The right hand side of this expression is the emission rate of LO-phonons that are governed by Bose-Einstein statistics. That is, if the frequency of LO-phonons, an angular frequency $\omega_{LO}$ can be increased, $1/\tau_{31}$ and $1/\tau_2$ can be kept high even if temperature of a crystal lattice, $T_{lattice}$, is raised. This means increasing LO-phonon energy makes it easier to form or maintain population inversion at higher temperature.

As seen from the above, adopting a GaN-based material can be advantageous, for one thing, for overcoming the unexplored frequency ranges through the shift of phonon domain, and for another thing, in terms of the possibility of higher temperature operation.

1-2. Experimental Confirmation with Four Quantum Well Structure

Figure 3:
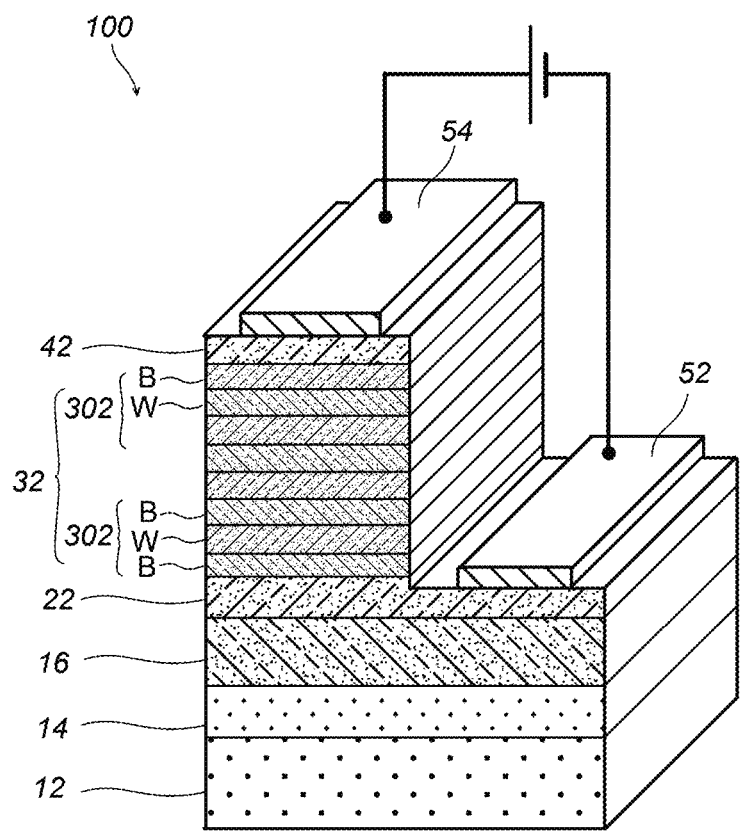
FIG. 3 is a perspective view showing the schematic structure of a conventional THz-QCL and a THz-QCL in an embodiment of the present disclosure.

On the basis of above-mentioned concept, the present inventors fabricated a THz-QCL and conducted studies on the operation thereof. FIG. 3 is a perspective view showing the schematic structure of a conventional THz-QCL and a THz-QCL in an embodiment of the present disclosure. A THz-QCL 100 includes a crystal of a GaN-based material, the crystal being formed on a substrate 12 being a sapphire substrate with suitable buffer layers 14 and 16 interposed therebetween. The crystal of a GaN-based material is roughly composed of a contact layer 22 (n⁺AlGaN), a super lattice 32, and a contact layer 42 (n⁺GaN). On the contact layers 22 and 42, electrodes 52 and 54 to which external voltage is applied are provided. In particular, the electrode 54 is a stacked metal body for forming a surface plasmon waveguide structure. If the THz-QCL 100 is generally made of a GaN-based material, for the electrode 54, Ti/Al/Ti/Au may be employed, for example.

In the super lattice 32, a large number, e.g., for 100 periods, of units 302, unit structures, are repeatedly disposed. Each unit 302 includes a barrier layer B and a well layer W, which provide electrons with a barrier and a potential well. In the case of a THz-QCL having a four quantum well structure, four well layers are provided for one unit 302, and four barrier layers B are provided, each of the barrier layers B being positioned between the well layers W.

Figure 4:
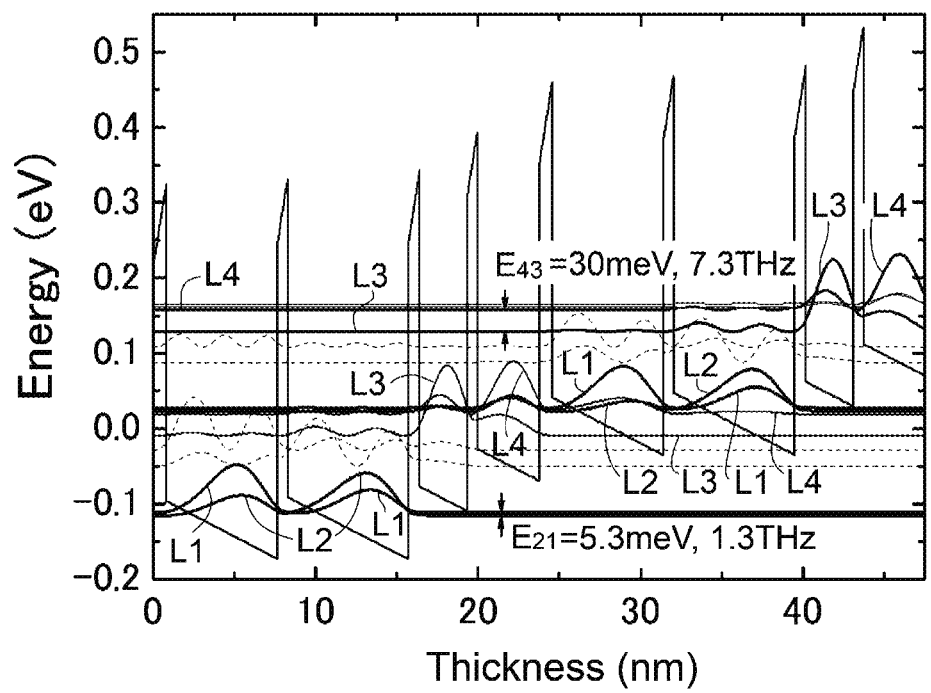
FIG. 4 is a graph of positional dependence of electric potential in a THz-QCL having a conventional four quantum well structure, and the electron probability distribution calculated from the wave function of each sub band.

FIG. 4 shows positional dependence of potential that acts on electrons in the THz-QCL having the four quantum well structure, and the electron probability distribution that is calculated from the wave function of each sub band. A pair of levels in which lasing is expected to occur in design process of the super lattice was levels L4 and L3, which were intended to be used for an upper lasing level and a lower lasing level, respectively. The expected lasing frequency was 30 meV (7.3 THz), which is a difference in energy value between the levels L4 and L3. To obtain population inversion in the levels L4 and L3, the energy difference between the level L3 and the level L2 was set at a value of 102 meV, which slightly exceeds the energy value of LO-phonons exhibited by a crystal of a GaN-based material (90 meV). When this condition is satisfied, electrons at the level L3 being a lower lasing level are efficiently and quickly depopulated to the level L2. The levels L2 and L1 were set so as to have the same energy as far as possible, that is, so as to be degenerated.

However, the observed electromagnetic wave was through spontaneous emission, having a center frequency of 1.37 THz and a great half width, a full width at half maximum (FWHM) of 170 GHz (0.7 meV). It was confirmed that the spontaneous emission corresponds to 5.3 meV (1.3 THz), which is an energy difference between the levels L2 and L1. This indicates that, although the frequency of lasing could not be adjusted as intended, a sub band structure was formed as designed to a certain extent. It should be noted that it was separately confirmed that each layer had a thickness close to a designed value. The present inventors believes that the reason why the levels L2 and L1 each exhibits an energy difference while canceling the degeneracy of energy as shown in FIG. 4, is due to a piezo-electric field. Also in terms of design, it is not easy to degenerate the energies of the levels L2 and L1 in the presence of a piezo-electric field. Note that, in FIG. 4, slopes found at potential bottoms of the well layer and potential crests of the barrier layer are due to the influence of a piezo-electric field. When a substrate having a polar face for its surface, such as a c-axis-orientated substrate of a sapphire, is used for the substrate 12, an internal electric field having alternating directions for every material is created due to residual strain, due to the mismatch between the crystal lattices at an interface at which a material changes to another one in a growing crystal, and piezoelectric effect.

2. Embodiment 1

In an embodiment reflecting the above findings, there will be realized a structure of levels, or sub band structure, that enables operation at an intended lasing frequency.

2-1. Lower-Level-Light-Emission Pure-Three-Level Structure

In the spontaneous emission operation in the experiment of the above-mentioned four quantum well structure, the frequency was not intended one. However, at the same time, the experiment gives a direct finding about a structure that facilitates light emission in that light emission by the spontaneous emission was actually obtained. That is, from the above experimental result, it can be useful to select levels that participate in light emission directly or indirectly (an upper lasing level and a lower lasing level) among levels that have lower energy values in each well layer. In addition, the fact that electrons were injected from the level L3 to the upper level in the actual light emission, the level L2 in FIG. 4, by the LO-phonon scattering endorses the usefulness of the LO-phonon scattering. Hence, in, a sub band structure is designed, according to one embodiment, based on the following concept:

To avoid light emission between unintended levels, a two quantum well structure being a simpler configuration is employed for the purpose of reducing the number of levels as far as possible.

Furthermore, in the first attempt, the following additional restriction is imposed.

The levels having lower energy values in well layers are selected as the upper and lower levels in light emission.

A sub band structure according to an embodiment that has the above features is referred to as a lower-level-light-emission pure-three-level structure in the present application. In the sub band structure, three levels participate in light emission directly or indirectly.

Figure 5A:
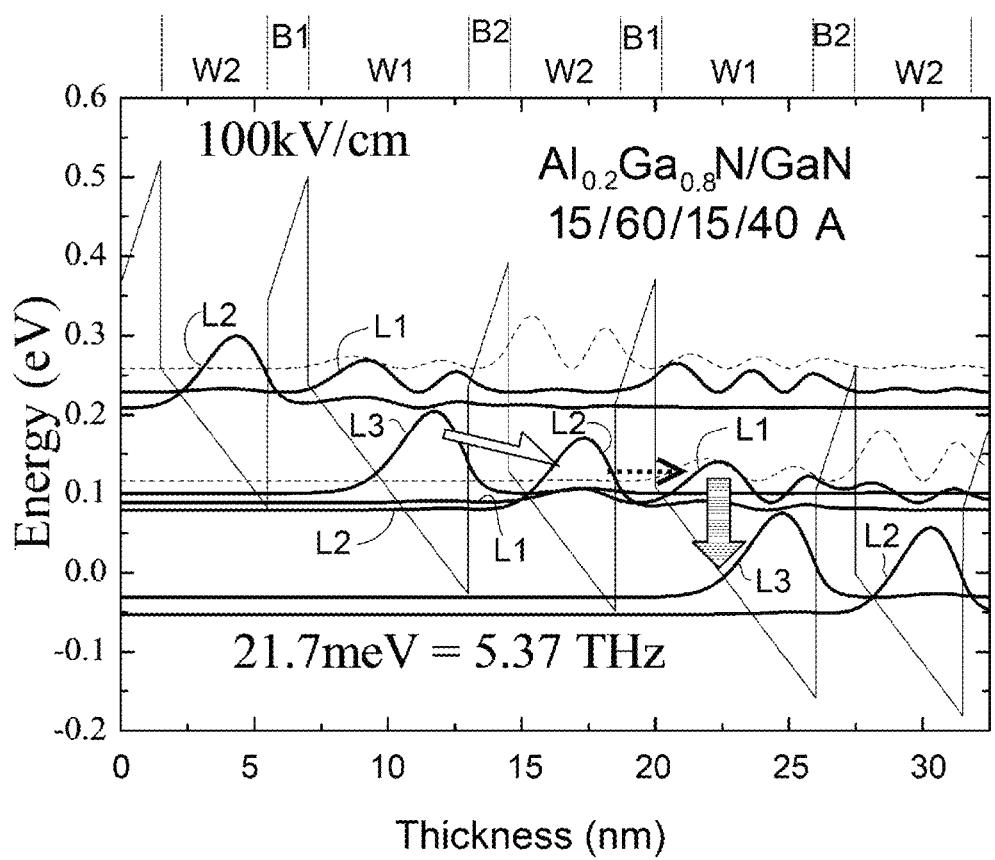
FIG. 5A is a graph showing positional dependence of electric potential, and an electron probability distribution calculated from the wave function of each sub band, in the configuration of a THz-QCL fabricated by an MBE in an embodiment of the present disclosure

2-1-1. Design and Experimental Confirmation with THz-QCL Fabricated by MBE Technique FIG. 5 shows the sub band structure of a THz-QCL that is employed for an embodiment of the present application. FIG. 5A shows changes in potential of an electron at positions in a thickness direction in which a crystal is caused to grow by the line chart. On the top axis of the graph in FIG. 5A, the ranges of barrier layers B1 and B2, and well layers W1 and W2 are shown. The unit 302 of a THz-QCL in the present embodiment includes the well layers W1 and W2 that differ in thickness from each other, and the barrier layers B1 and B2 that separate the well layers W1 and W2 from each other. More in detail, the barrier layer B1, the well layer W1, the barrier layer B2, and the well layer W2 are disposed in this order. The sub band structure shown in FIG. 5A is formed inside the super lattice 32. This sub band structure is realized by employing a GaN for the well layers W1 and W2, and an $Al_{0.2}Ga_{0.8}N$ for the barrier layers B1 and B2, configuring the barrier layer B1, the well layer W1, the barrier layer B2, and the well layer W2 to have thicknesses of 15, 60, 15, 40 angstroms, or 1.5, 6.0, 1.5, and 4.0 nm, in this order, and thereafter applying an appropriate bias electric field. As seen from the above, the super lattice of the THz-QCL in an embodiment is formed by two quantum wells and two barrier layers per period (unit). Note that the structure of the THz-QCL is similar to the structure of the THz-QCL 100 shown in FIG. 3, except for the inside of the unit 302. In the present application, unless otherwise noted, the thicknesses of the layers forming the stacked body are expressed only in the form of their numerical values, in units of angstroms, with slashes (/) interposed therebetween, in the order of the barrier layer B1, the well layer W1, the barrier layer B2, and so forth.

When an external voltage is applied between the electrodes 52 and 54, the potential has a gradient due to a DC bias electric field created in the super lattice 32. The sub band of an electron is influenced by the gradient. Under the bias electric field, the energy level structure exhibited by an electron in each unit, or unit structure, has levels L1, L3, and L2. The level L1 is a mediation level that has a significant probability of existence of an electron in the well layer W1. The level L3 is an upper lasing level. The level L3 has an energy value lower than the energy value of the level L1, and the energy difference between the level L3 and the level L1 is greater than the energy value of LO-phonons exhibited by a nitride semiconductor crystal forming the super lattice 32. The energy difference between the level L1 and the level L3 will be described below. The level L3 has a significant probability of existence of an electron in the well layer W1. The level L2 is a lower lasing level and has a significant probability of existence of an electron in the well layer W2.

When an electron that makes a transition from the level L3 (the upper lasing level) to the level L2 (the lower lasing level) experiences stimulated emission, the resulting frequency of the electromagnetic wave becomes a lasing frequency. The energy difference between the level L3 and the level L2 is 21.7 meV according to this design, and thus 5.37 THz corresponding thereto is a designed lasing frequency. If a nitride semiconductor forming the super lattice is a GaN-based material, the energy value of LO-phonons is about 90 meV, which is greater than the photon energy for the electromagnetic wave.

The phenomena occurring in an electron in the lower-level-light-emission pure-three-level structure are light emission, resonant tunneling (RT), and LO-phonon scattering, in this order. The LO-phonon scattering is useful to form population inversion through mediation by the level L1, together with RT, between a pair of levels, of the levels L3 and L2, that participate in light emission. Most conventional designs have been based on the concept of maintaining population inversion by, in a pair of levels that participates in light emission, adding a level that increases injection efficiency of electrons into an upper level being one of the pair (referred to as an injection level or the like) and a level that serves a function of depopulating electrons from an lower level being the other one (referred to as a depopulation level or the like), to the above pair of levels, which are provided separately from each other. From the viewpoint of this concept, the level L1 in Embodiment 1 in itself serves a function of LO-phonon scattering, in combination with RT, if needed, so as to be a level that serves both functions of the injection level and the depopulation level at the same time.

Figure 5B:
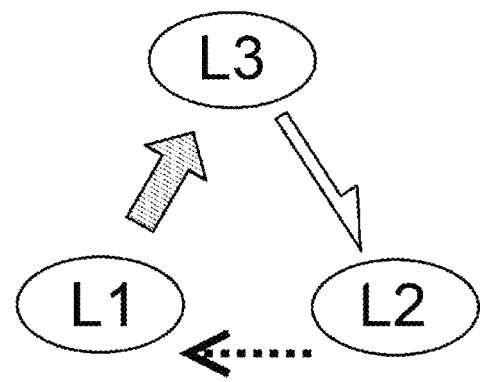
FIG. 5B is a schematic diagram of the behavior of an electron in a reduced depiction scheme.

FIG. 5B shows a schematic diagram of the behavior of an electron in an ideal operation, focusing only on the kinds of levels in each unit, which is reduced into one unit. Since the units 302 are disposed in a repeating manner in the super lattice 32 of the THz-QCL structure, periodicity can be found also in a series of phenomena such as transition and transport of electrons in an actual operation. The phenomena that occur in a process of passing through a plurality of units one by one can be depicted in the form of the behavior of electrons that connect the levels included in one unit. In the lower-level-light-emission pure-three-level structure, the levels L3 and L2 serve as the upper lasing level and the lower lasing level, respectively, and thus an electron at the level L3 makes a transition to the level L2 with radiation. An electron at the level L2 is transported to the level L1 through resonant tunneling. The level L1 serves as the above-mentioned mediation level. The electron at the level L1 makes a quick transition toward the level L3 of a unit on a downstream side, by LO-phonon scattering. Such phenomena are shown in FIG. 5A as a series of arrows that sequentially line, and depicted in FIG. 5B as a loop formed by arrows connecting the levels, which is reduced into one unit.

In particular, in Embodiment 1, the number of wave functions that contribute to the electronic transport and the light emission is three, which is a conceivable minimum value. In this sense, the sub band structure in the THz-QCL element in Embodiment 1 can be referred to as pure-three-level system. In addition, every wave function contributing to the electronic transport and the light emission has a significant value for any one or more of the well layers. For this reason, transitions from the level L2 to the level L1 is expected to be transitions at a high rate due to LO-phonon scattering, and thus the energy difference between the level L1 and the level L2 is set at 90 meV or more, as close to 90 meV as possible. In addition, the bias electric field in FIG. 5 is applied such that the direction thereof points to the positive polarization direction of the well layers (the GaN layers).

Here, the level that injects electrons into the level L3 is the level L1 alone, and a level that serves the function of depopulating electrons from the level L2 is also the level L1 alone. As shown in FIG. 5B, the order of the behavior of electrons is injection, transition with radiation, and depopulation. The injection is indirect pumping by LO-phonon scattering. The transition with radiation is a diagonal transition in which a large shift is observed in the position of an electron (the center of mass in the real space) when the position is compared before and after the transition. In addition, the depopulation is obtained through resonant tunneling of electrons. This depopulation substantially involves scattering by LO-phonons immediate after the resonant tunneling. That is, the LO-phonon scattering causes the level L1 that is to be a mediation level to participate in both injection and depopulation to form population inversion, and thus it can be considered that the level L1 plays these two roles. It is noted that, as to the level L1, while the injection targets electrons moving to the level L3 that has a significant probability of existence in the same well layer W1 in a similar manner, the depopulation targets electrons from the level L2 that has a significant probability of existence in the well layer W2 of a unit on an upstream side.

That is, if the behavior of electrons under the bias electric field for the operation is tracked, electrons at the level L1 being a mediation level in each unit are scattered by LO-phonons, making a transition to the level L3 being an upper lasing level. Electrons at the level L3 emit electromagnetic waves when making a transition to a lower lasing level through stimulated emission. At that point, the emitted electromagnetic waves have a photon energy corresponding to the energy difference between the level L3 and the level L2. Electrons at the level L2 tunnel through the barrier layer B1 of the other unit on a downstream side by resonant tunneling conduction, being transported to the level L1 of the unit on the downstream side.

Furthermore, the electron densities among the levels L3 to L1 are calculated. For the calculation, a self-consistent rate-equation is used, in consideration with electron-electron scattering and electron-LO-phonon scattering. At this point, bulk LO phonon approximation is employed. The parameters thereof are a temperature of 20 K and a sheet electron density Ns of $6.4 \times 10^{10}$ cm$^{-2}$. As a result, the populations of the levels L3 to L1 are found to have values shown in Table 1.

TABLE I

| Sub band n | Population (cm$^{-2}$) |
| --- | --- |
| L3 | $6.38 \times 10^{10}$ |
| L2 | $2.21 \times 10^{8}$ |
| L1 | $1.29 \times 10^{7}$ |

As stated above, it is confirmed, through the calculation, that population inversion can be realized between the levels L3 and L2, which are expected to be the upper lasing level and the lower lasing level.

Figure 6A:
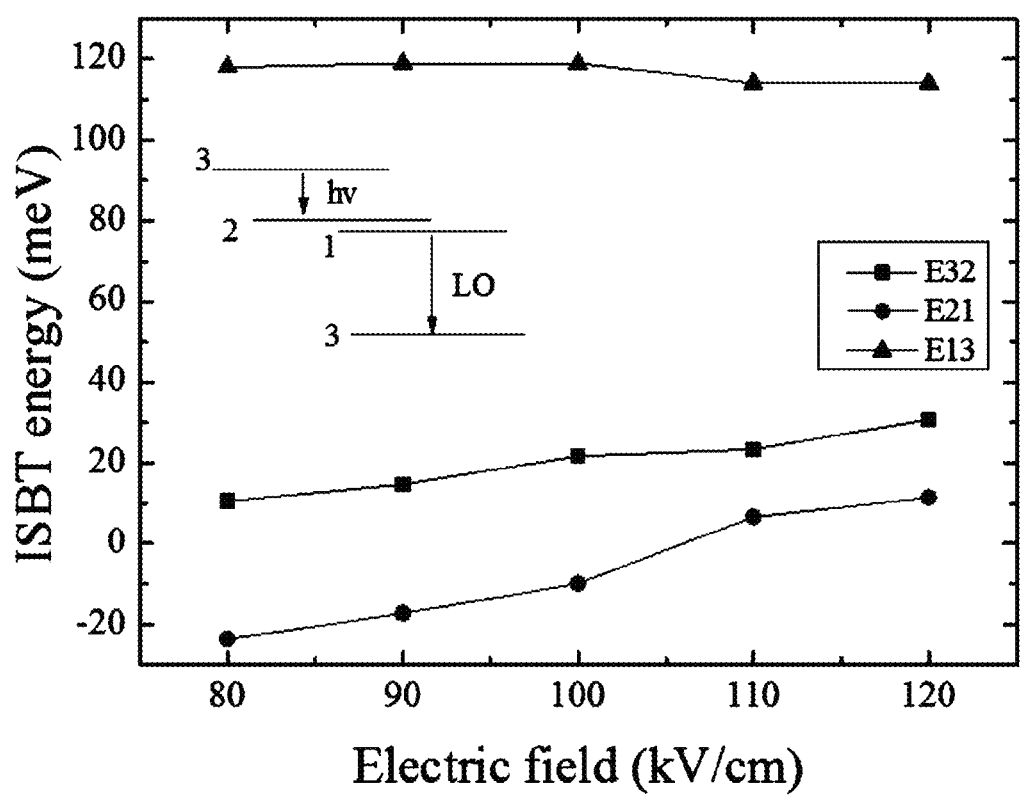
FIG. 6A is a graph depicting the energy difference between sub bands.
Figure 6B:
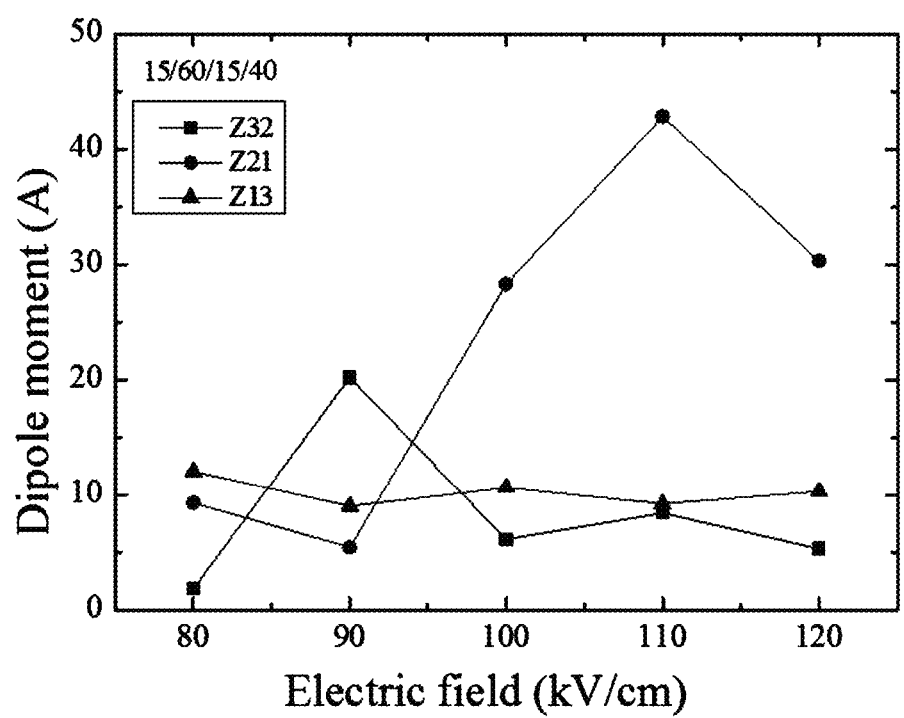
FIG. 6B is a plot of dipole moment with respect to a bias electric field strength, in a THz-QCL fabricated by an MBE in an embodiment of the present disclosure.

Furthermore, the energy differences between levels and dipole moments are calculated with respect to bias electric field strength as shown in FIG. 6A. A bias electric field that causes lasing to occur satisfies the following conditions: (1) $E_{21}$ is close to 0 meV; (2) $E_{13}$ is equal to or more than the energy value of LO-phonons (90 meV); and (3) a dipole moment $Z_{21}$ reaches its maximum. As seen from FIG. 6A, these conditions are satisfied near 100 to 110 kV/cm range. As shown in FIG. 5A, lasing operation at about 5.4 THz can be expected in this bias electric field.

The present inventors actually fabricated a THz-QCL designed in accordance with the above. For deposition technique of the super lattice 32, a molecular beam epitaxy (MBE) technique and a metalorganic chemical vapor deposition (MOCVD) technique were employed. In the first place, a THz-QCL fabricated by the MBE technique will be described. Although the overall structure of the fabricated THz-QCL is the same as the structure shown in FIG. 3, a layer structure in the unit 302 of the super lattice 32 was fabricated so as to be the sub band structure in FIG. 5. A THz-QCL having a structure very similar to the design was fabricated by forming layers having accurate thicknesses over multiple periods in a super lattice, while crystallinity and structural properties are enhanced.

With reference to FIG. 3, and more specifically, for the substrate 12, a c-axis-oriented sapphire substrate was used, for which the polarity of a growth direction was configured to be a group III polarity. To form the buffer layers 14 and 16 on the substrate, the MOCVD technique was employed, and an AlN layer and an AlGaN layer were formed. The AlN layer being the buffer layer 14 served as a template on which the buffer layer 16 is subjected to crystal growth, whereas the AlGaN layer being the buffer layer 16 served as a template on which crystals of a GaN-based material to be the contact layer 22, the super lattice 32, and the contact layer 42 are subjected to crystal growth. GaN was employed for the material of the well layers W1 and W2 of the super lattice 32, whereas $Al_{0.2}Ga_{0.8}N$ was employed for the material of the barrier layers B1 and B2. That is, the Al composition ratio of AlGaN in the barrier layer B was set at 0.2, as shown in FIG. 5A. The contact layers 22 and 42 sandwiching the super lattice 32 were configured to be made of the same compositions for the AlGaN and the GaN for the barrier layer, except for the doping component thereof. The contact layers 22 and 42 were configured to have an amount of Si doping of $1 \times 10^{18}$ cm$^{-3}$ or more. For the surface plasmon waveguide structure, Ti/Al/Ti/Au was used as the electrode material of the electrode 54.

Of the buffer layer 14 and the buffer layer 16 (AlN+AlGaN templates) to be caused to grow on the substrate 12 being a sapphire substrate using MOCVD, the AlN template was formed to be of good quality by employing an alternate pulsed supply technique. In the alternate pulsed supply technique, first, a process for growing AlN microcrystals is performed, and second, a burying process for burying the gaps between crystalline nuclei is performed. These processes are performed by continuously supplying an Al material gas, e.g., tri-methyl-aluminum(TMAl), and supplying an ammonia gas in a pulsed manner. In the burying process, enhanced lateral growth in which growth in lateral direction is enhanced is employed. Furthermore, third, a process of alternately performing continuous supply fast vertical growth that gains a growth rate and the enhanced lateral growth. The continuous supply fast vertical growth has an effect on planarization and the suppression of cracking. In contrast, the enhanced lateral growth is a condition that facilitates coherent crystal growth in the lateral direction (in-plane direction, nonpolar direction) with respect to the crystals of the formed crystalline nuclei and has an effect on reducing a threading dislocation density. The crystal growth condition is mainly controlled by a supply ratio between the source gases, in particular, a gas for group V elements, (e.g., ammonia, and a gas for group III elements, e.g., TMAl. The third process of alternately performing the continuous supply fast vertical growth that gains a growth rate and the enhanced lateral growth, is repeated as needed.

For the MBE crystal growth of the super lattice 32, a Droplet Elimination through Thermal Annealing (DETA) technique was employed, which had been developed by the present inventors to enhance one of techniques categorized in radio-frequency molecular beam epitaxy (RF-MBE). DETA is a deposition technique for fabricating hetero materials, and disclosed by the present inventors in, for example, Non Patent Literature 4. That is, in RF-MBE growth of a group III nitride semiconductor, a flat and high-quality film is formed by setting the source supply ratio (III-V ratio) between group III elements (Ga and Al) and a group V element (N) under the condition: III-V ratio >1. However, in a condition in which group III elements exist in abundance (a group III-rich condition), the growth is inhibited by the precipitation of droplets of a group III material on a growing surface. In the DETA technique, after the growth under the group III-rich condition at a given growth temperature, (e.g., at a substrate temperature of 820° C., the temperature is significantly increased from the growth temperature, and the substrate temperature is increased to, for example, 900° C. Then, an equilibrium vapor pressure near the growth temperature is in the relationship: (vapor pressure of a Ga (or Al)>(vapor pressure of GaN or AlN), and thus only the droplets of the group III material can be volatilized and removed with no influences on the formed film. By returning the temperature to the growth temperature and resuming the deposition, the growth by RF-MBE can be continued while sufficiently suppressing the influence of droplets. The frequency of the removal of droplets can be determined as appropriate, and for example, droplets can be removed every ten units during the growth. The duration of the substrate temperature for the removal of droplets can be adjusted such that it is comparable to a duration during which intensity of reflection high energy electron diffraction (RHEED) is regained. In the DETA technique, it is possible to accurately control a film thickness as compared to a conventional technique such as N-irradiation, whereby periodicity is maintained more preferably even when the number of units of a super lattice is increased, and to suppress crystal defects e.g., edge dislocations and mixed dislocations, during the growth process.

Furthermore, in order to reduce the ohmic contact resistances of the electrodes 52 and 54, annealing was carried out at a temperature of 450 C or more for at least 30 seconds. To fabricate the ridge structure, chlorine-based ICP dry etching was used. As a patterning metal of the electrode 54, Ni was used. Fabrication processing into the device size involves substrate cleavage, and thus it is necessary that a sapphire substrate should be reduced in thickness to 200 microns or less. For this reason, the thickness of the substrate 12 was set at 150 microns or less.

Figure 7A:
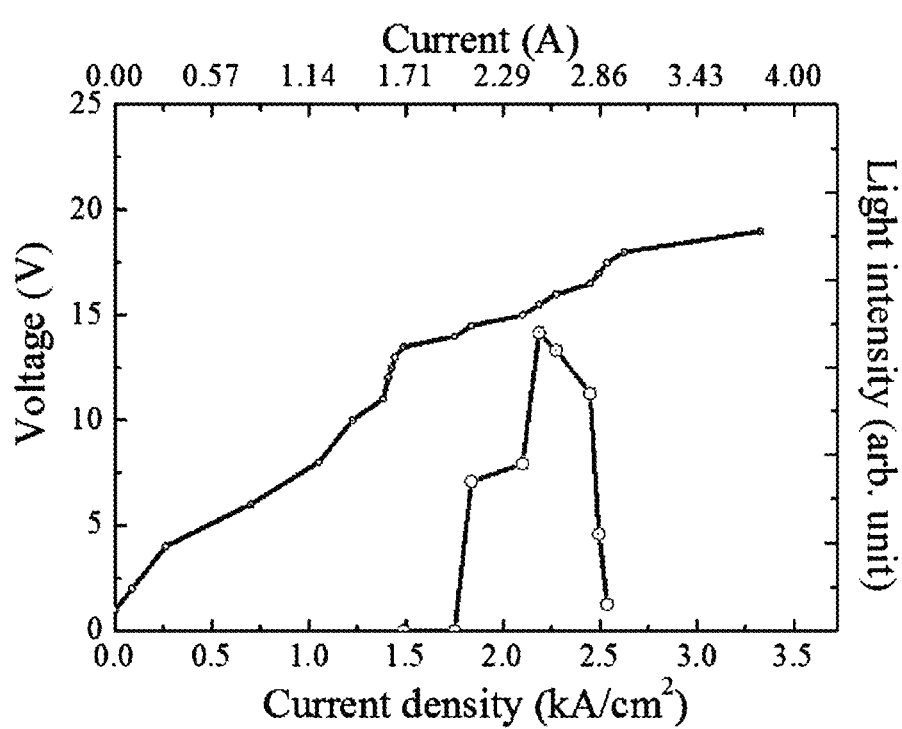
FIG. 7A is a graph depicting electric current-light intensity characteristics and electric current-voltage characteristics obtained through observation of a THz-QCL fabricated by an MBE in an embodiment of the present disclosure.

FIG. 7A shows an example of characteristics measured from the fabricated THz-QCL sample. The number of periods of quantum cascade laser structure in the sample was 100 units, and the amount of Si doping in a GaN quantum well with a film thickness of 60 angstroms was $5 \times 10^{17}$ cm$^{-3}$. The element size was set such that a cavity length was 1.143 mm and a ridge width was 100 μm. The measurement condition was set such that the driving repetition frequency was 122 Hz, the pulse width was 200 ns, and the measurement temperature was 5.6 K. For the measurement, a measuring element e.g., a silicon bolometer, was used. As a result, a lasing spectrum at around 5.5 THz was observed near an external voltage of 14.5 to 16.5 V, which was substantially as designed. This lasing spectrum had a half width at around 11 to 13 GHz, which was almost equal to the resolution of FTIR (Fourier-Transform Infrared Spectroscopy) apparatus (7.5 GHz) used for the measurement, and substantially monochromatic electromagnetic waves were emitted. In addition, according to the I-V curve, threshold operation was confirmed, although it was slight, near the external voltage at which the electromagnetic-wave emission was obtained. The threshold current density was 1.75 to 2.5 kA/cm$^{-2}$. It is thereby concluded that stimulated emission was realized with the fabricated THz-QCL sample. Note that the same properties were observed in a plurality of samples.

Figure 7B:
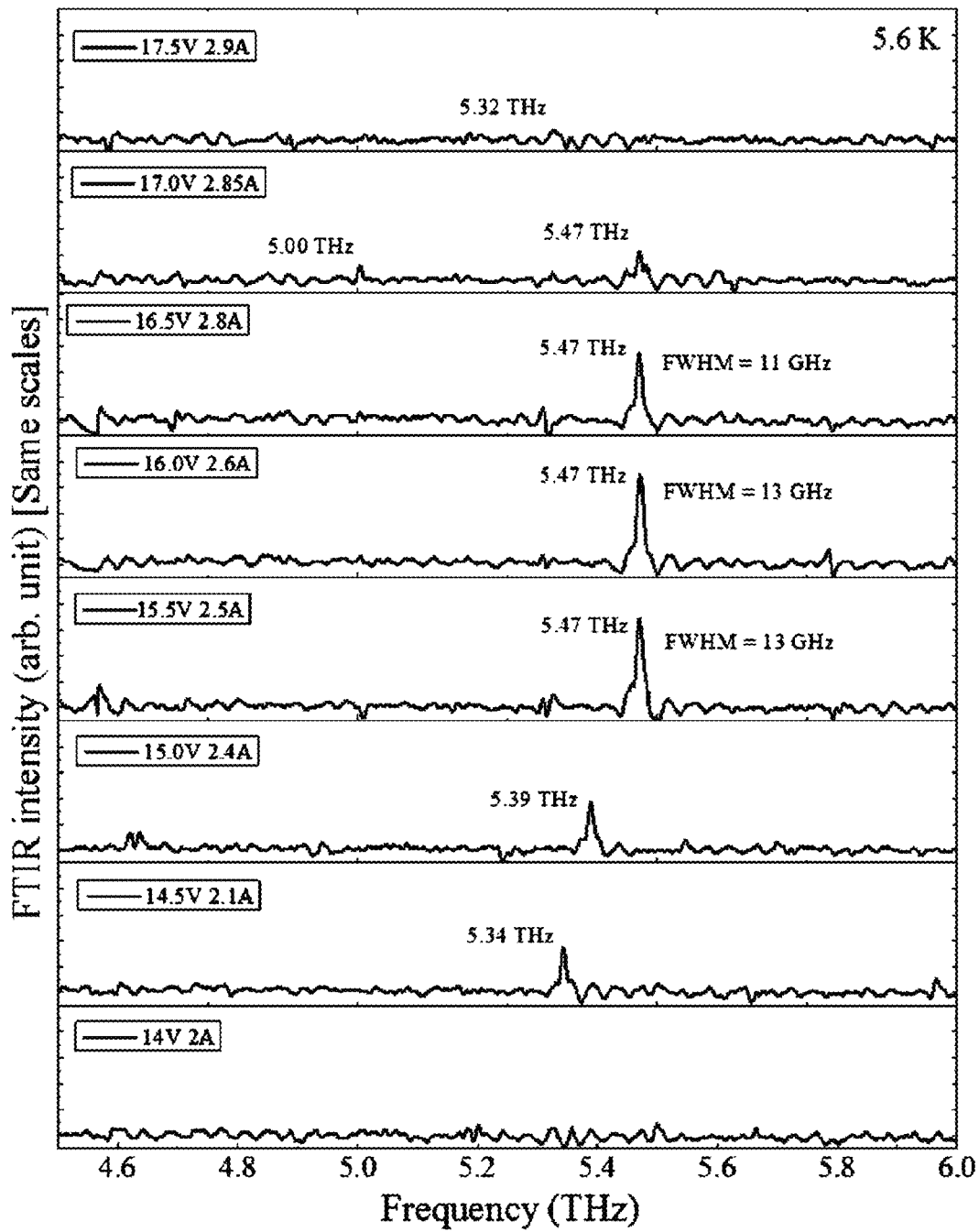
FIG. 7B is a graph depicting emission spectra for several currents, obtained through observation of a THz-QCL fabricated by an MBE in an embodiment of the present disclosure.
Figure 30:
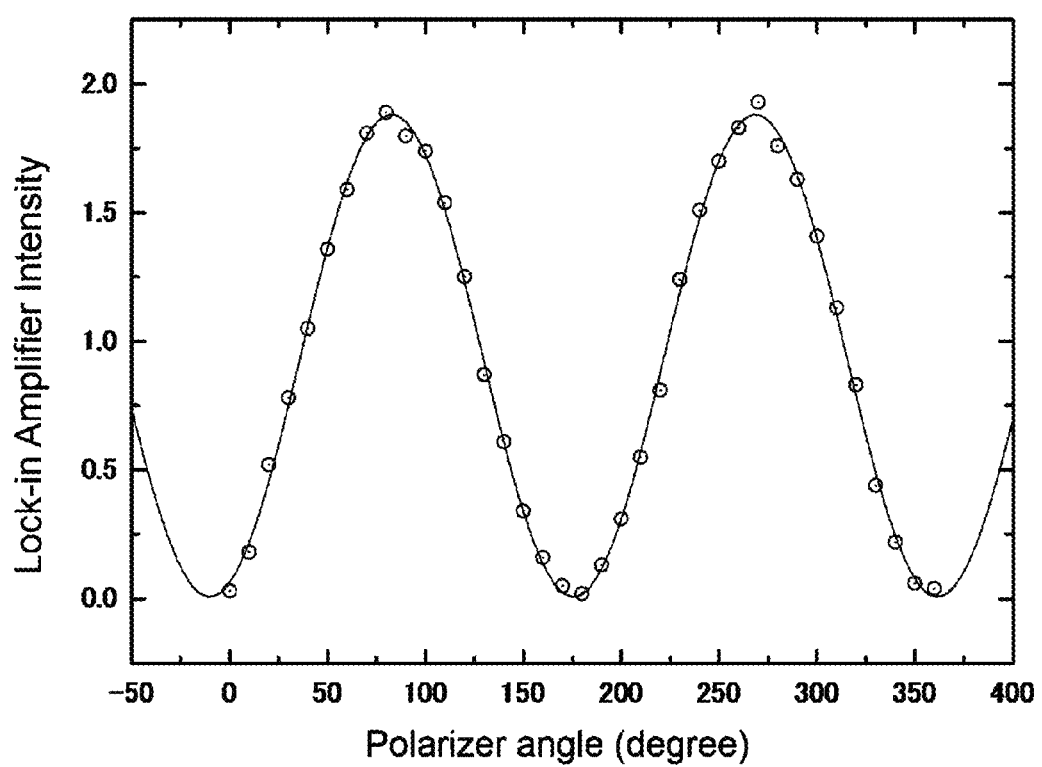
FIG. 30 is a graph of the measured intensity values obtained by causing an output from the THz-QCL sample having the sub band structure of the THz-QCL shown in FIG. 5A to pass through a wire-grid polarizer.
Figure 31:
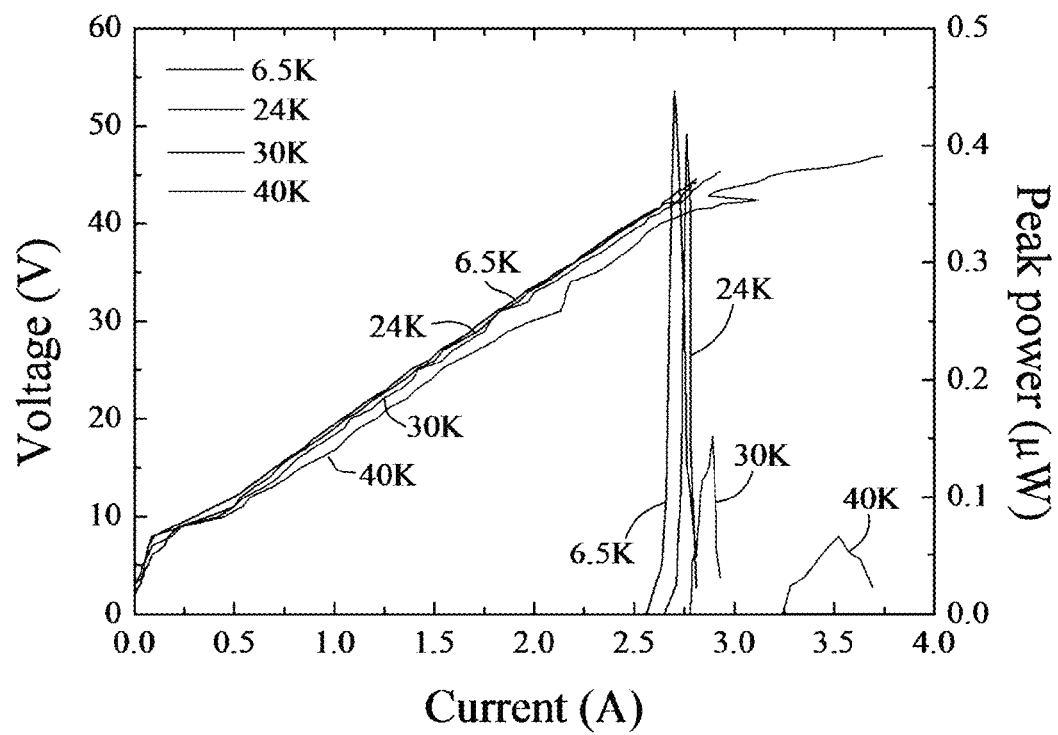
FIG. 31 is a graph showing electric current-light intensity characteristics and electric current-voltage characteristics observed with temperature varied using a THz-QCL sample having a sub band structure of the THz-QCL as shown in FIG. 5A.
Figure 32:
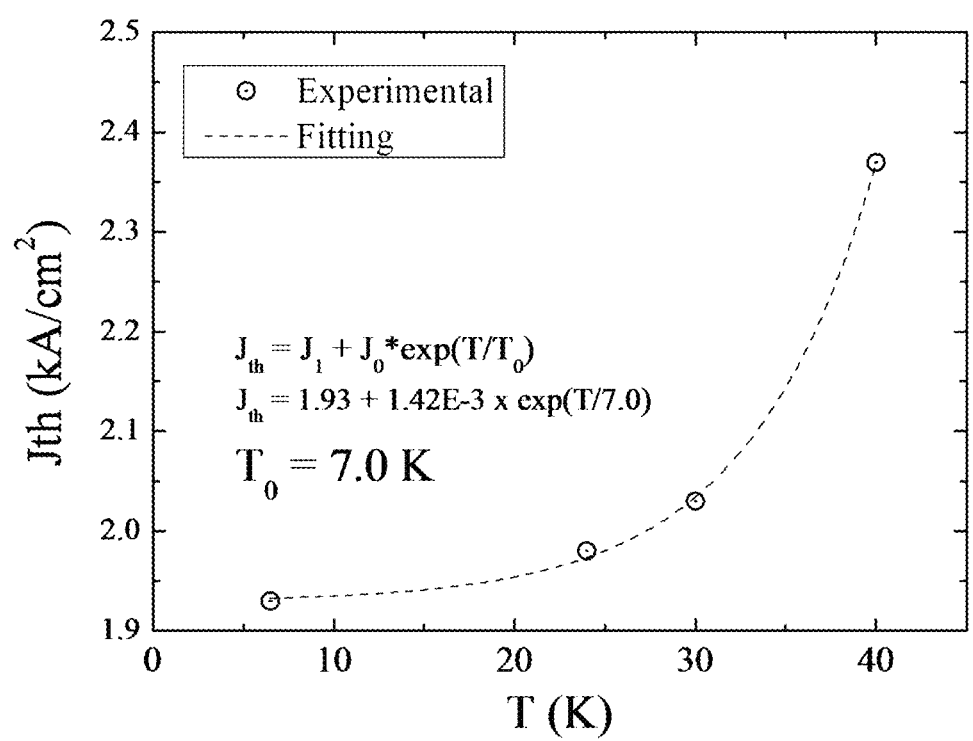
FIG. 32 is a graph of lasing thresholds $J_{th}$ as a function of temperature, obtained from the measured value in FIG. 31.

In another THz-QCL sample (an additional THz-QCL sample) configured to have the sub band structure of the lower-level-light-emission pure-three-level structure shown in FIG. 5A, it was confirmed that the output of the additional THz-QCL sample exhibited polarization and the additional THz-QCL sample operated at higher temperature. The additional THz-QCL sample had been fabricated in the same manner with the above-mentioned sample with which the result shown in FIGS. 7A,7B were obtained, except that the amount of Si doping in the GaN quantum well having a film thickness of 60 angstroms in the super lattice 32 (FIG. 5A)

was set at $1 \times 10^{18}$ cm$^{-3}$. Then, it was confirmed that pulse drive having a pulse width of 200 ns and a repetition frequency of 980 Hz generated an output having a half width of 5.76 THz, which was sufficiently narrow, almost exactly as designed. Then, when the intensity of the output was measured while the output was caused to pass through a wire-grid polarizer, the dependence of sine wave with one cycle period of 180° in the polarizer angle was observed in the intensity, as shown in FIG. 30. The wire-grid polarizer used at that point has a degree of polarization of 96%, and a measuring system for the output intensity is one including a Tsurupica condenser lens, a silicon bolometer, and a lock-in amplifier and having a sufficient signal-to-noise ratio. It was confirmed, from the sine wave lasing obtained in such a manner, that the output radiated from the additional THz-QCL sample was TM polarized light that exhibited a degree of polarization of 92% or more. This indicates that the output is of the lasing by inter-subsub band transition. Furthermore, the measurement at a different temperature was conducted using the additional THz-QCL sample. By pulse drive having a pulse width of 200 ns and a repetition frequency of 985 Hz, lasing was observed at temperatures of 6.5, 24, 30, and 40 K as shown in FIG. 31. FIG. 32 shows lasing thresholds $J_{th}$ of this additional THz-QCL sample at the temperatures, which were 1.93 and 2.37 kAcm$^{-2}$ at 6.5 K and 40 K, respectively. The changes in lasing threshold by temperature were fitted by an expression shown in a graph, in which a characteristic temperature $T_0$ was 7.0 K. In the above manner, the lasing operation in an unexplored frequency range of more than 5.2 THz and 12 THz or less was realized with the THz-QCL having the lower-level-light-emission pure-three-level structure in the present embodiment in which the super lattice 32 was formed by MBE.

2-1-2. Experimental Confirmation with THz-QCL

Figure 8A:
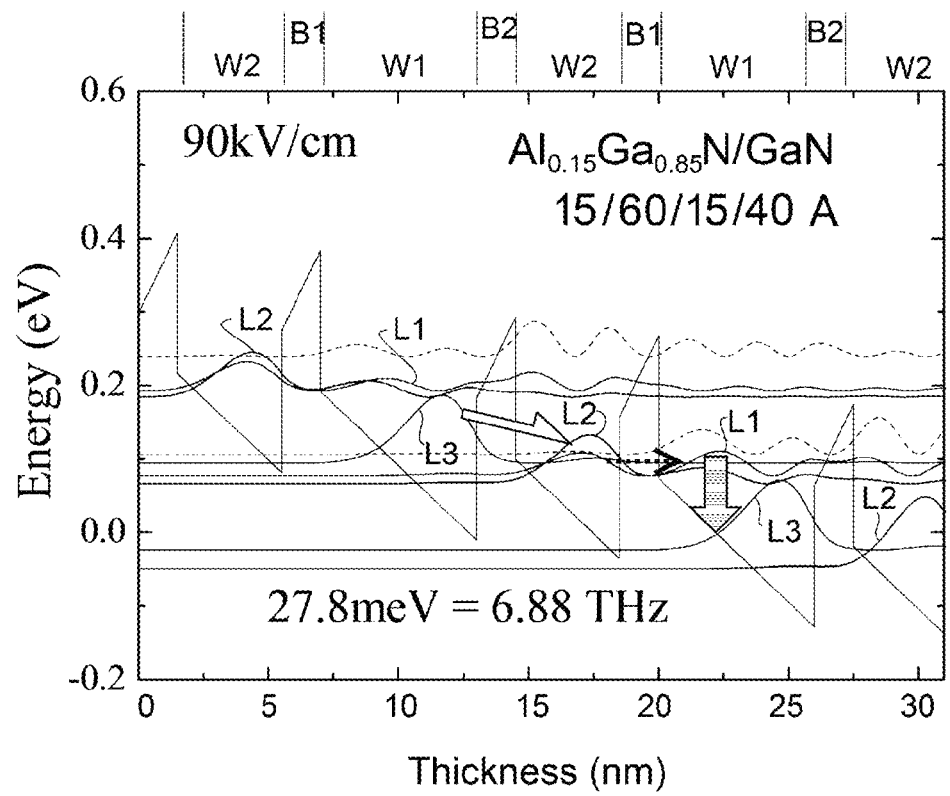
FIG. 8A is a graph showing positional dependence of electric potential and an electron probability distribution calculated from the wave function of each sub band, for a structure of the THz-QCL fabricated by an MOCVD in an embodiment of the present disclosure.
Figure 8B:
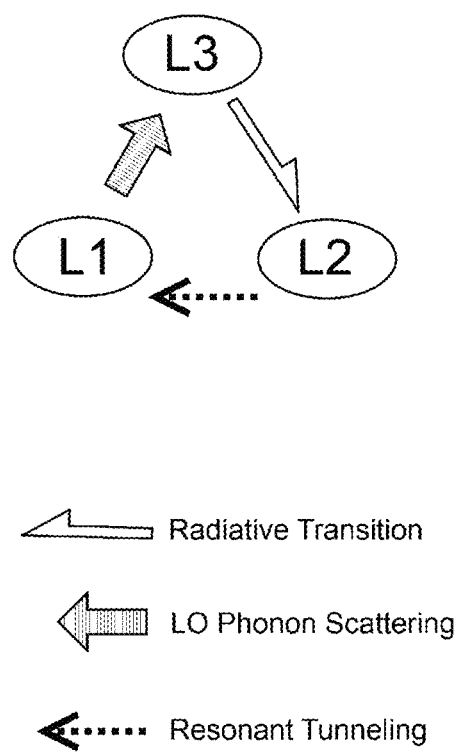
FIG. 8B is a schematic diagram of behavior of an electron in a reduced depiction scheme for the embodiment shown in FIG. 8A.
Figure 9A:
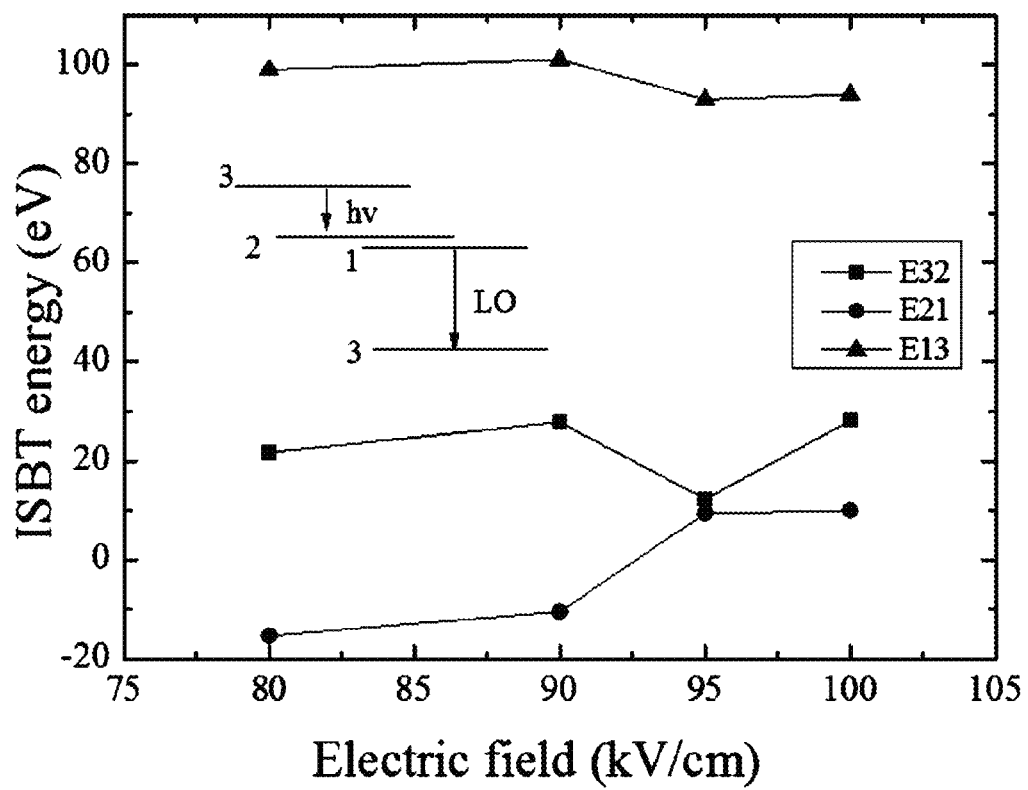
FIG. 9A is a graph depicting energy differences between sub bands with respect to a bias electric field strength, in a THz-QCL fabricated by an MOCVD in an embodiment of the present disclosure.
Figure 9B:
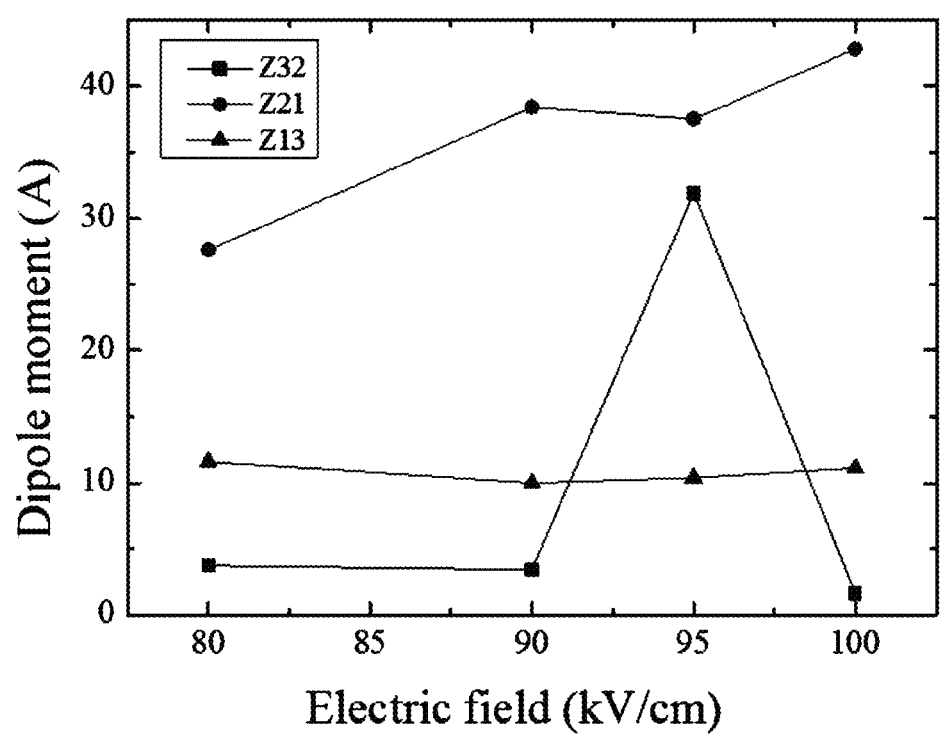
FIG. 9B is a graph depicting energy differences between dipole moments with respect to a bias electric field strength, in a THz-QCL fabricated by an MOCVD in an embodiment of the present disclosure.

Fabricated by MOCVD Technique Furthermore, experimental confirmation was also conducted employing MOCVD technique for the deposition technique. First, the super lattice was redesigned to be adapted to the MOCVD technique. FIGS. 8A, 8B are graphs showing positional dependence of electric potential, and electron probability distribution calculated from the wave function of each sub band, in the structure of a THz-QCL fabricated by the MOCVD. In addition, FIGS. 9A, 9B shows graphs of energy differences between sub bands and dipole moment, respectively, as a function of a bias electric field strength, for a THz-QCL fabricated by the MOCVD. The results shown in FIGS. 8A,8B and 9A,9B indicate that, even for a barrier layer material for the MOCVD technique, there is no substantial obstacle in the fabrication of a THz-QCL with which lasing near 6.9 THz can be expected. That is, under a bias electric field under which $E_{21}$ takes on values near zero (90 to 95 kV/cm), $E_{31}$ exceeds 90 meV, which is the value of LO-phonon energy of the material, and a dipole moment $Z_{21}$ reaches its maximum although being almost unchanged. From an experimental perspective, it was confirmed that the MOCVD technique is different from the MBE technique in deposition properties. The difference in deposition properties will be described later.

Figure 10A:
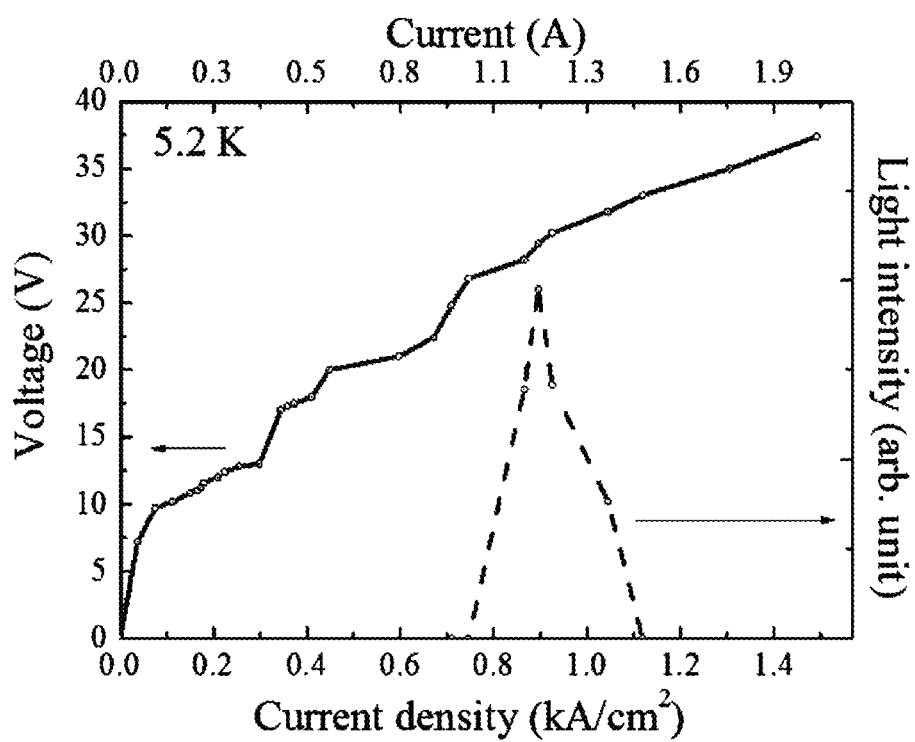
FIG. 10A is a graph depicting electric current-light intensity characteristics and electric current-voltage characteristics obtained through observation of a THz-QCL fabricated by an MOCVD in an embodiment of the present disclosure.
Figure 10B:
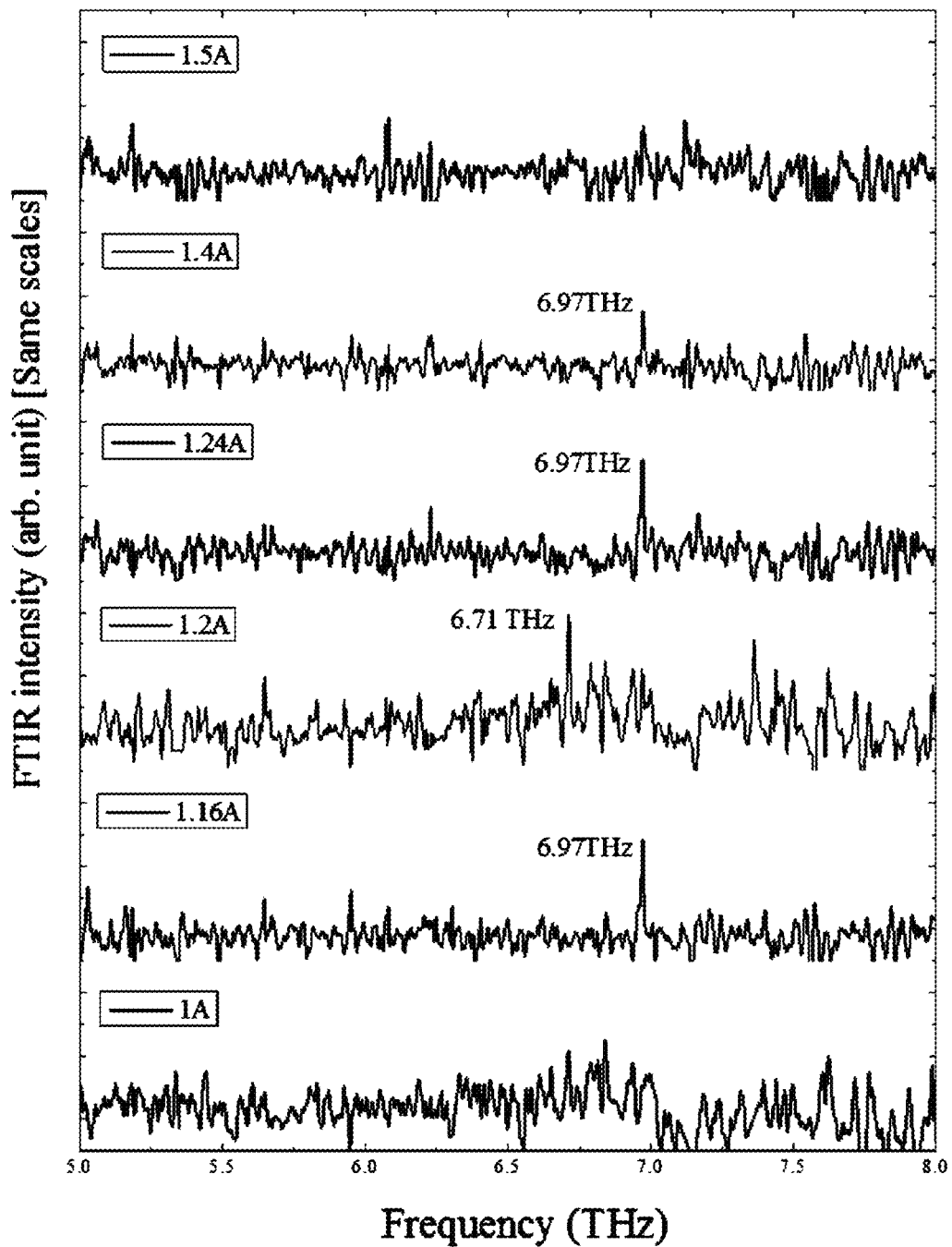
FIG. 10B is a graph depicting emission spectra for several currents obtained through observation of a THz-QCL fabricated by an MOCVD in an embodiment of the present disclosure.

FIGS. 10A,B show the properties of the THz-QCL fabricated by the MOCVD technique. The number of periods in the sample quantum cascade structure was 200 units, and the amount of Si doping in a GaN well layer (W1) having a film thickness of 60 angstroms was 0.009 sccm in terms of doping gas flow. The element size was set in such a manner that the cavity length was 1.138 mm and the ridge width was 100 μm. The measurement condition was set in such a manner that a driving repetition frequency was 122 Hz, the pulse width is 200 ns, and the measurement temperature was 5.2 K. For the measurement, a silicon bolometer was used. The reason why the units equivalent to 200 periods were formed in the sample is that the MOCVD technique allows a good crystal to grow even if the more number of units are stacked than in the MBE. As seen from FIGS. 10A, 10B, lasing operation was confirmed also in the THz-QCL fabricated by the MOCVD technique. The lasing frequency was about 6.71 to 6.97 THz, while it was designed to be 6.88 THz. In addition, the spectral line width thereof was 8.9 GHz, which is almost equal to the 7.5 GHz resolution of an Fourier-Transform Infrared Spectroscopy (FTIR) apparatus used for the measurement. In addition, according to the I-V curve, threshold operation was confirmed, although it was slight, near the external voltage at which the electromagnetic-wave emission was obtained. The threshold current density was 0.85 kA/cm$^2$.

2-1-3. Overcoming Unexplored Frequency in THz-QCL Through Experiment

Figure 11:
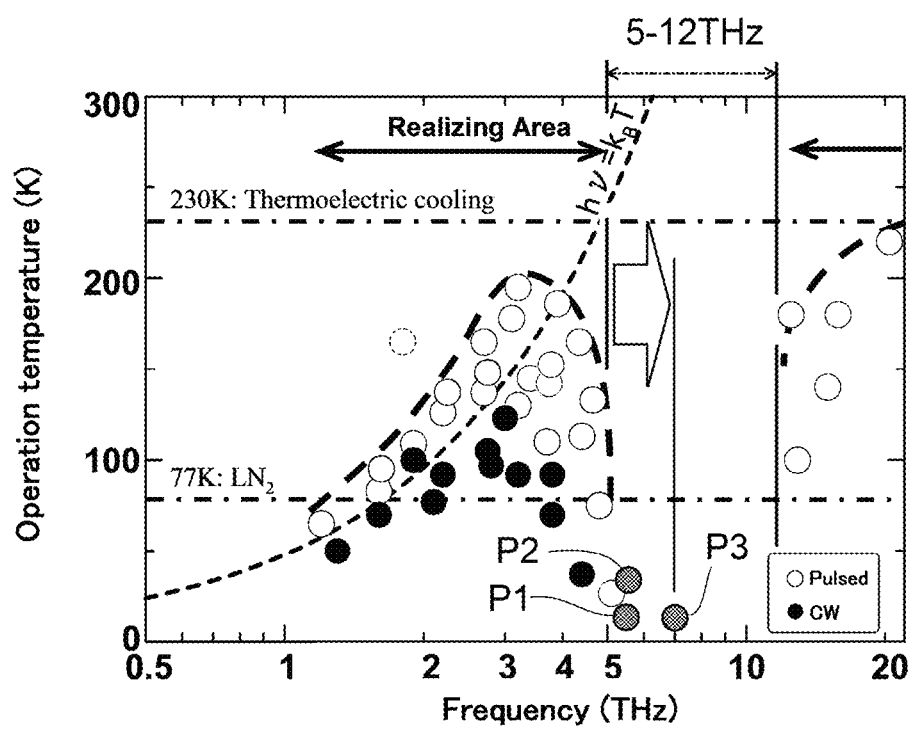
FIG. 11 is a graph as in FIG. 1, to which values obtained by demonstrating the THz-QCL in an embodiment are added.

As described above, with the THz-QCLs fabricated by the different deposition techniques, the MBE technique and the MOCVD technique, lasing operations at 5.47 THz, 5.76 THz, and 6.97 THz, out of a range of 5 to 12 THz (to be exact, over 5.2 THz and 12 THz or under), which have been unexplored frequency, were confirmed through experiment for the first time. FIG. 11 shows operating conditions under which the lasing operations were demonstrated. Points P1, P2, and P3 plotted in FIG. 11 each represent new lasing frequencies in the unexplored frequency ranges and a maximum operation temperature that were experimentally confirmed in the present embodiment.

Figure 12A:
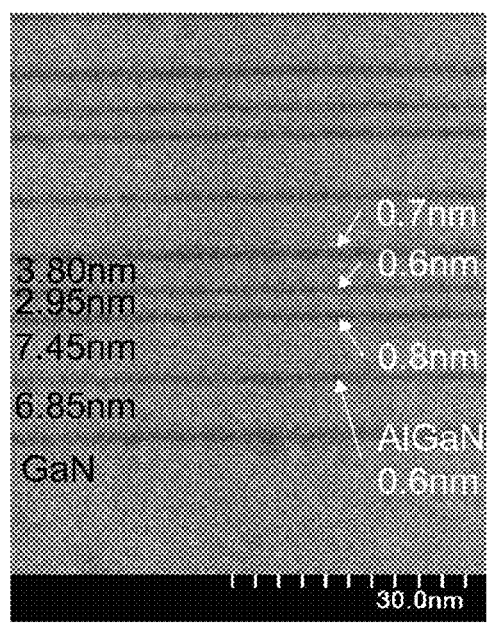
FIG. 12A is a TEM cross-section micrographs of super lattices grown by an MBE technique in an embodiment of the present disclosure.
Figure 12B:
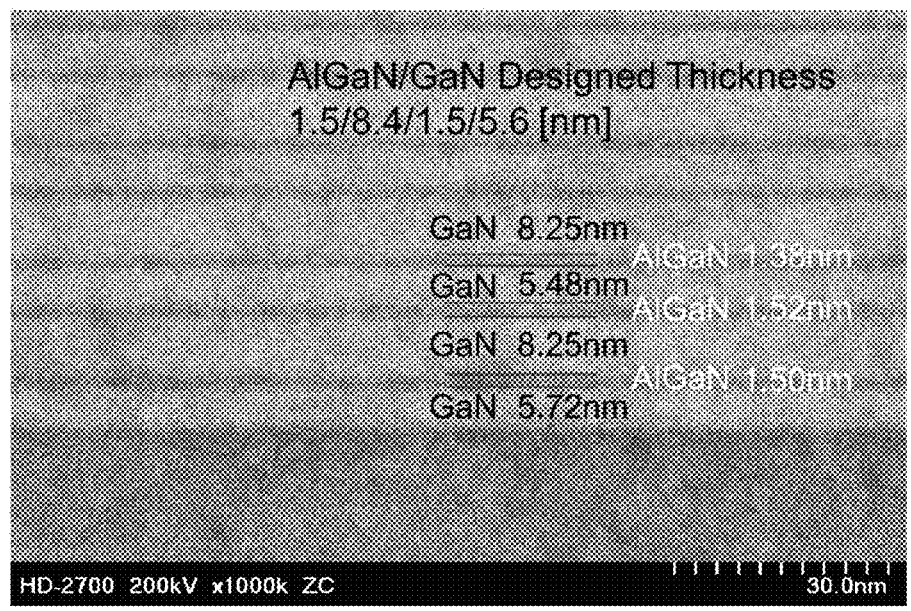
FIG. 12B is a TEM cross-section micrograph of super lattices grown by an MOCVD technique.
Figure 13A:
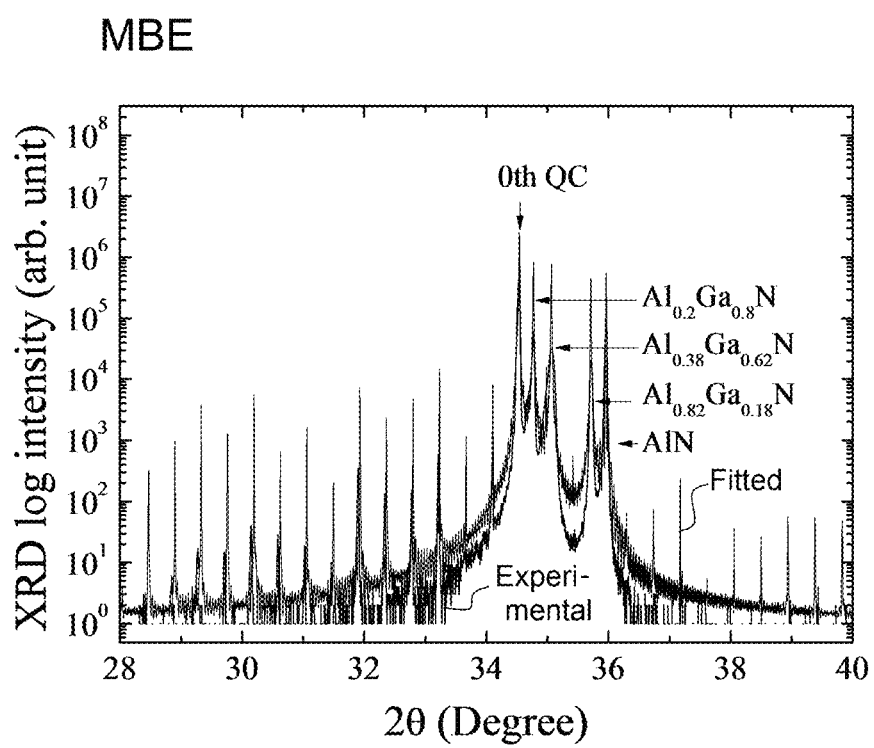
FIG. 13A is a graph of predicted and measured X-ray diffraction intensity values for super lattices grown using an MBE technique in an embodiment of the present disclosure.
Figure 13B:
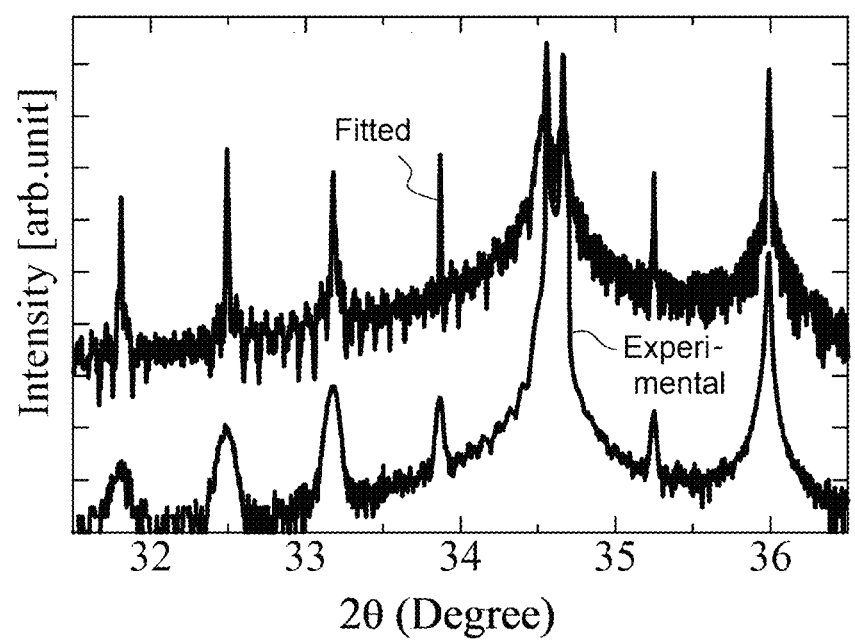
FIG. 13B is a graph of predicted and measured X-ray diffraction intensity values for super lattices of the embodiment shown in FIG. 13A, grown by an MOCVD technique.

Now, the MBE technique and the MOCVD technique employed for the super lattice 32 will be described through comparison therebetween. When the super lattices 32 are fabricated by the MBE technique and the MOCVD technique, a difference occurs in deposition properties due to the methods of fabricating. The differing deposition properties are the controllability of crystal growth and crystal quality. FIGS. 12, 13, and 14 are all drawings and graphs TEM cross-section micrographs, X-ray diffraction images, and mapping images of X-ray diffraction into a reciprocal lattice space in this order, with respect to grown super lattices, for illustrating the comparison between the MBE technique and the MOCVD technique. In FIGS. 13A,B, graphs of calculated values that are fitted using thickness as a parameter are also shown as overlays. Note that the TEM cross-section micrographs (FIG. 12A) are not of the samples fabricated in the present embodiment but ones of another design; they are images captured from super lattices fabricated by the respective deposition methods using materials as with the present embodiment. These micrographs are shown to demonstrate that similar tendencies have been observed also in the fabrication of the super lattices in the present embodiment.

Figure 14A:
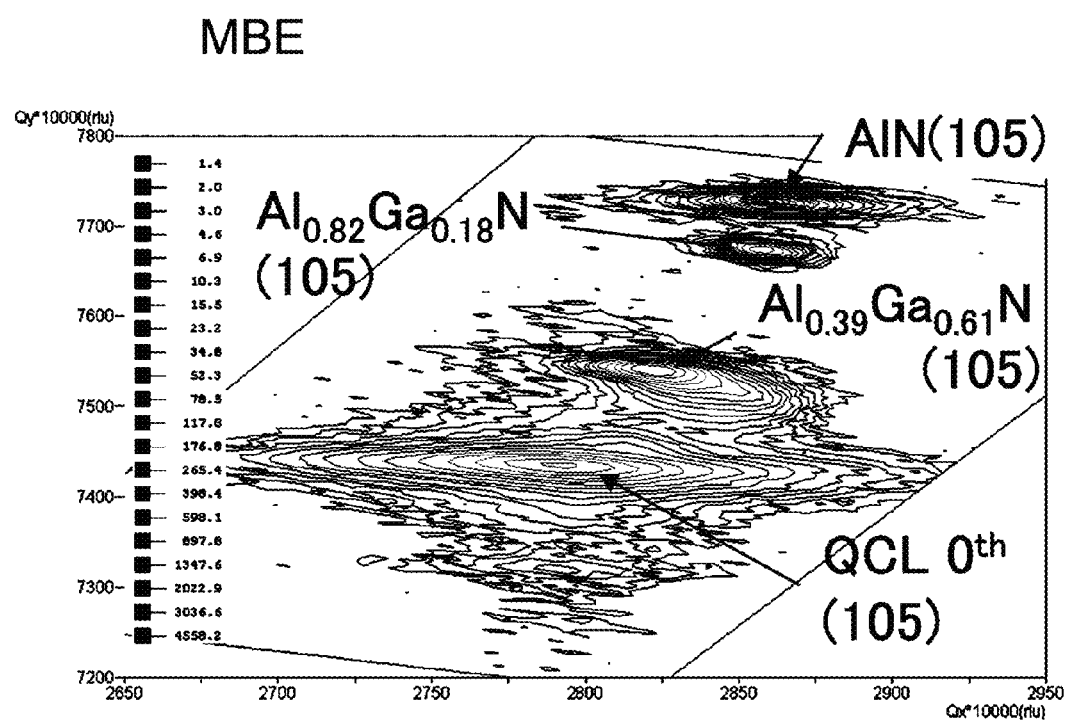
FIG. 14A shows mapping images of X-ray diffraction into a reciprocal lattice space of super lattices that are grown using an MBE technique in an embodiment of the present disclosure
Figure 14B:
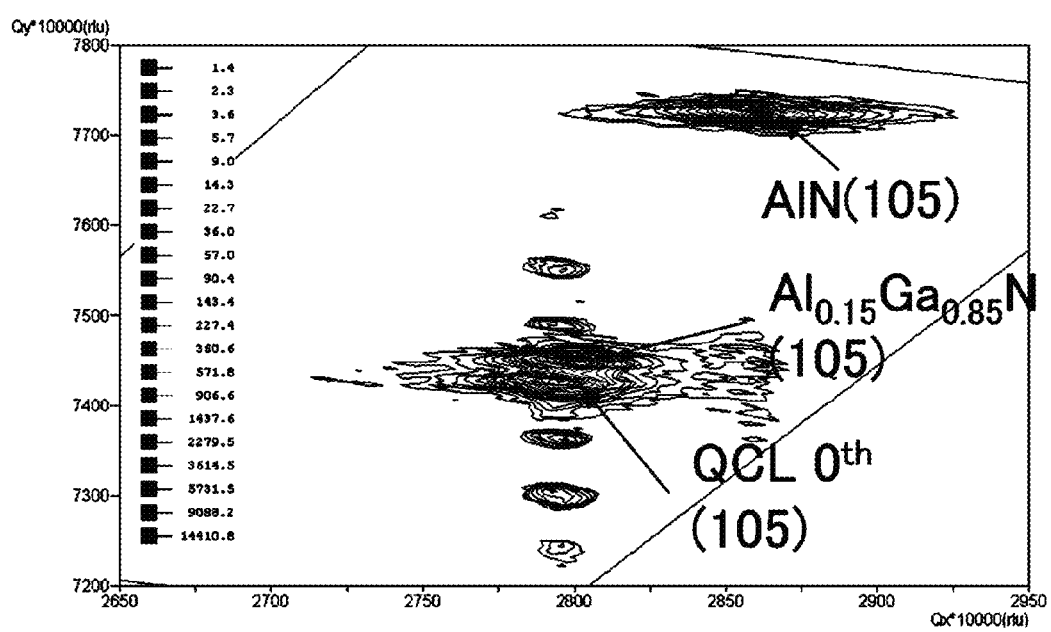
FIG. 14B shows mapping images of X-ray diffraction into a reciprocal lattice space of super lattices according to the embodiment shown in FIG. 14A, grown using an MOCVD technique.

As illustrated in FIGS. 12A,B, in regard to changes in the materials of the super lattices of GaN/AlGaN, or sharpness of the interfaces, the MBE technique yields interface sharpness of about 1 ML (monolayer), whereas the MOCVD technique yields a slightly larger interface sharpness of about 2 ML. That is, the MBE technique surpasses the MOCVD technique in the sharpness of interfaces. In FIGS. 13A,B, the X-ray diffraction measurement results and the fitting results of calculation on the samples fabricated by the MBE technique and the MOCVD technique are shown, respectively. The actually obtained film thicknesses are determined by fitting calculation of the graph in such a manner that the peak angle of diffraction figures obtained through the experiment can be reproduced, and the film thicknesses in the MBE technique and the MOCVD technique deviate from a design value, or target value, by only ~1% and ~4%, respectively. It was confirmed that both the MBE technique and the MOCVD technique can provide the fabrication with film thicknesses that are sufficiently close to the design value. Then, as shown in FIGS. 14A, 14B, in terms of the crystal quality of the super lattices (i.e., how few crystal defects are included), the MOCVD technique surpasses the MBE technique. More specifically, in the measurement example shown in FIGS. 14A,B, an omega half width seen at a 0th peak of a (105)-plane QCL was 1103 $\sec^{-1}$ in the MBE technique, whereas 260 $\sec^{-1}$ in the MOCVD technique. This indicates that the sample fabricated by the MOCVD technique has a small area along a-axis (horizontal axis) with less significant mosaic and relaxation properties of the crystal plane thereof, as compared with the sample by the MBE technique. In regard to crystal quality described here, the MOCVD technique relatively surpasses the MBE technique. The values of total dislocation density were $\sim 10^{10}$ to $\sim 10^{11}$ cm$^{-2}$ in the MBE technique and $\sim 2.2 \times 10^9$ cm$^{-2}$ in the MOCVD technique. In this connection, the value of total dislocation density of an AlN template was $2.6 \times 10^9$ cm$^{-2}$. Although the lasing operation was confirmed with both the super lattices formed by the MBE technique and the MOCVD technique, there is the difference in deposition properties described here.

Figure 15A:
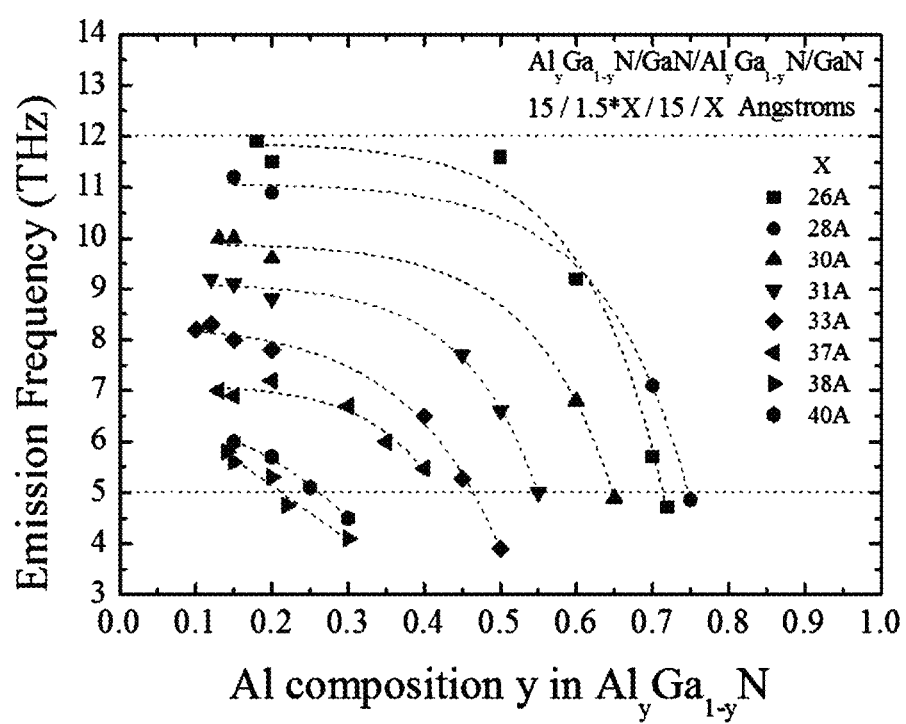
FIG. 15A shows performance diagrams of the investigated results of lasing frequencies through theoretical calculation, with variations in composition ratio that has an influence on barrier height and variations in thickness of the well layer, which are design parameters of the THz-QCL in an embodiment of the present disclosure.
Figure 15B:
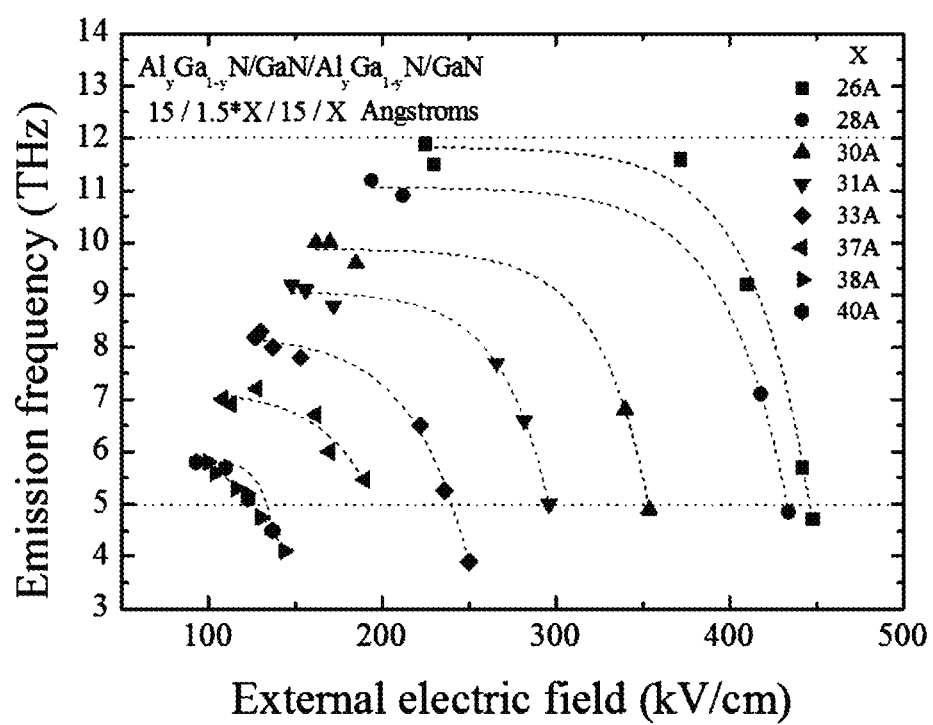
FIG. 15B shows performance diagrams of the investigated results of lasing frequencies through theoretical calculation, with variations in bias electric field and variations in thickness of the well layer in an embodiment of the present disclosure.

2-1-4. Possibility of Lasing in Unexplored Frequency Range with Lower-Level-Light-Emission Pure-Three-Level Structure Next, using a lower-level-light-emission pure-three-level structure, the feasibility of a THz-QCL capable of lasing at unexplored frequency ranges was studied with theoretical design. FIGS. 15A,B shows characteristic diagrams of the results of researching emission frequencies through theoretical calculation, with variations in composition ratio that has an influence on barrier height and variations in thickness of the well layer, which are design parameters of the THz-QCL (FIG. 15A), and with variations in bias electric field and variations in thickness of the well layer (FIG. 15B). The emission frequency on the vertical axis shows frequencies equivalent to the energy differences between levels L3 and L2. In this calculation, the thicknesses of two GaN well layers are varied with the relative ratio thereof kept to 2:3. FIG. 15A shows emission frequencies that are plotted with respect to the values of thickness while varying an Al composition influencing barrier height. FIG. 15B shows, in each condition, emission frequencies that are plotted with respect to bias electric field strength by an external applied voltage. As a result, it was confirmed that lasing is feasible in a range of 5 to 12 THz, which is the unexplored frequency range.

This result allows us to introduce guiding principles in design for a lower-level-light-emission pure-three-level structure. First, a smaller thickness of the above-mentioned well layer causes the emission energy to be increased. In addition, a smaller Al composition of the barrier layer corresponding to a shorter barrier height, causes the emission energy to be increased, allowing the frequency to be increased. At this point, the lower limit of the Al composition is determined to be an Al composition with which the mediation level, L1 shown in FIG. 5 and FIG. 8, is no longer bound to the well layer W1, or with which the energy difference between the mediation level and the upper lasing level falls below the LO-phonon energy. In contrast, the upper limit of the Al composition is determined to be an Al composition with which the light emission frequency becomes 5 THz or less. A stronger bias electric field causes the emission energy to be reduced. A smaller thickness of the well layer causes the value of a bias electric field necessary for lasing to be increased.

In such a manner, on the basis of the concept in Embodiment 1, it is confirmed, through theoretical calculation, that a THz-QCL the lasing frequency of which is in the unexplored frequency range of 5 to 12 THz can be designed, and a design guide on that occasion is established.

Note that the design guide described here is established on a particular assumption. It can be appreciated that, to change the lasing frequency, it is necessary to employ a layer structure adapted to the lasing frequency and to adjust a bias electric field by applying an appropriate external voltage. In the study on the design guide in Embodiment 1, the layer structure is adjusted by changing the thickness of the well layer and changing the AlN composition ratio of AlGaN of the barrier layer. Changeable parameters other than these may include the thickness ratio of the well layers, the thickness ratio of the barrier layers, and a fraction of aluminum of each barrier layer. The above parameters having influences on the layer structure can be easily changed by selecting a deposition scheme, or adjusting fabricating conditions e.g., material.

Figure 16A:
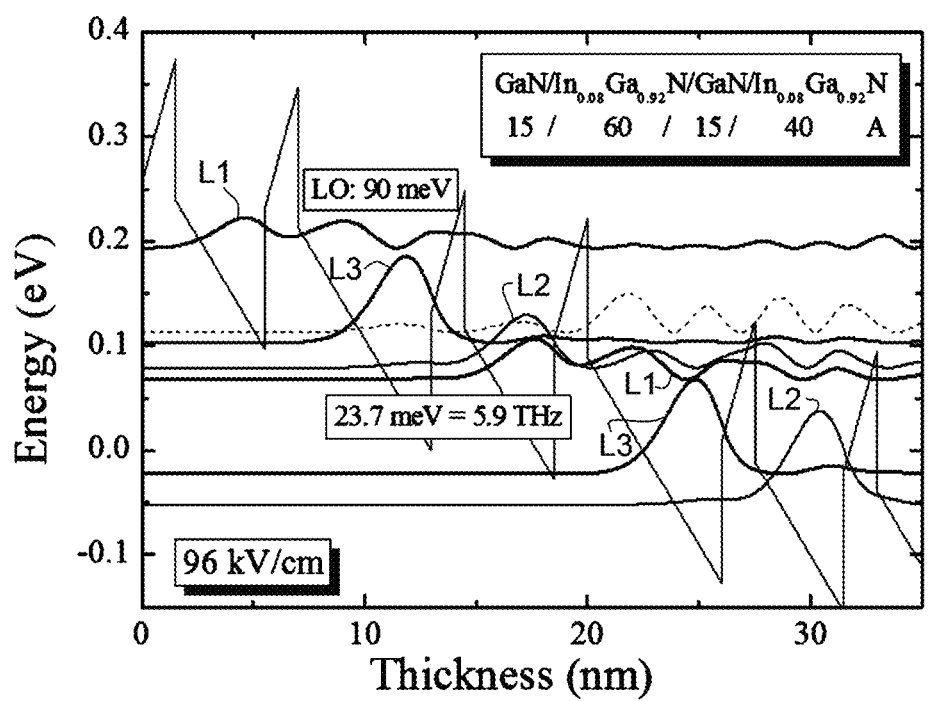
FIG. 16A is a graph showing positional dependence of electric potential and an electron probability distribution calculated from the wave function of each sub band, for structures of a THz-QCL for which a GaN/InGaN material is employed in a structure in which lasing occurs at around 6 THz, according to an embodiment of the present disclosure.
Figure 16B:
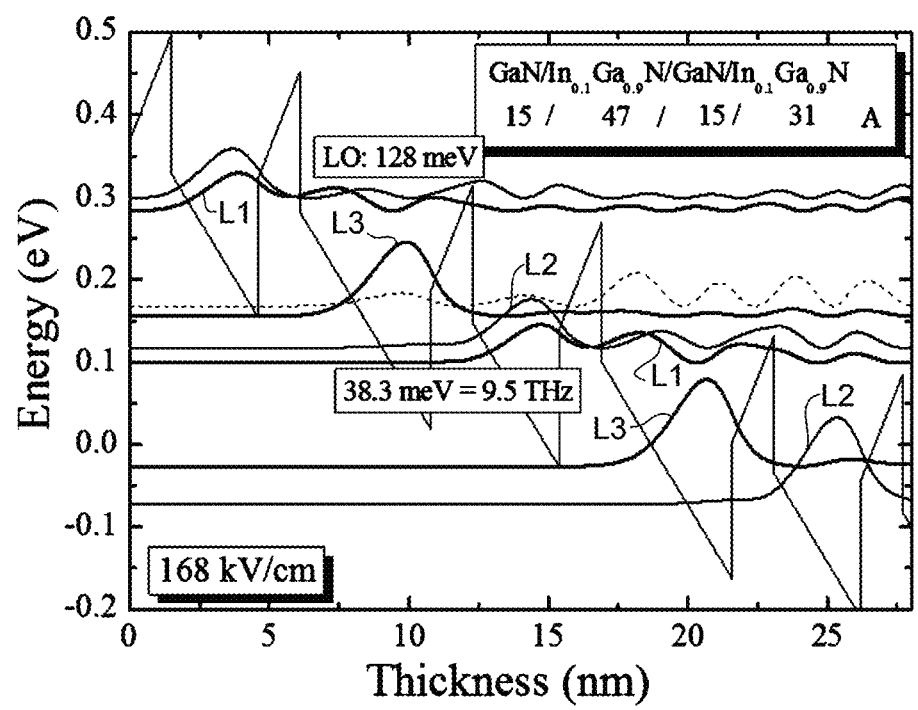
FIG. 16B is a graph showing positional dependence of electric potential and an electron probability distribution calculated from the wave function of each sub band, for structures of a THz-QCL for which a GaN/InGaN material is employed in a structure in which lasing occurs at around 10 THz, according to an embodiment of the present disclosure. and for another structure with which lasing occurs at around 10 THz (FIG. 16B).

2-1-5. Application of Lower-Level-Light-Emission Pure-Three-Level Structure to Other Materials The lower-level-light-emission pure-three-level structure in the present embodiment is applicable to other GaN-based materials. In particular, a structure for which GaN and InGaN, being GaN-based materials, are employed and in which barrier layers/well layers are GaN/InGaN is advantageous because GaN can be used as a base material in deposition. FIGS. 16A,B are graphs showing positional dependence of electric potential, and electron probability distribution calculated from the wave function of each sub band, in the structure of a THz-QCL for which a GaN/InGaN material is employed, in a structure with which lasing occurs at around 6 THz (FIG. 16A), and in a structure with which lasing occurs at around 10 THz (FIG. 16B). In addition, FIG. 17 is a graph showing variations in lasing frequency with respect to In composition ratio, which has an influence on the barrier height of a THz-QCL for which a GaN/InGaN material is employed.

Figure 17:
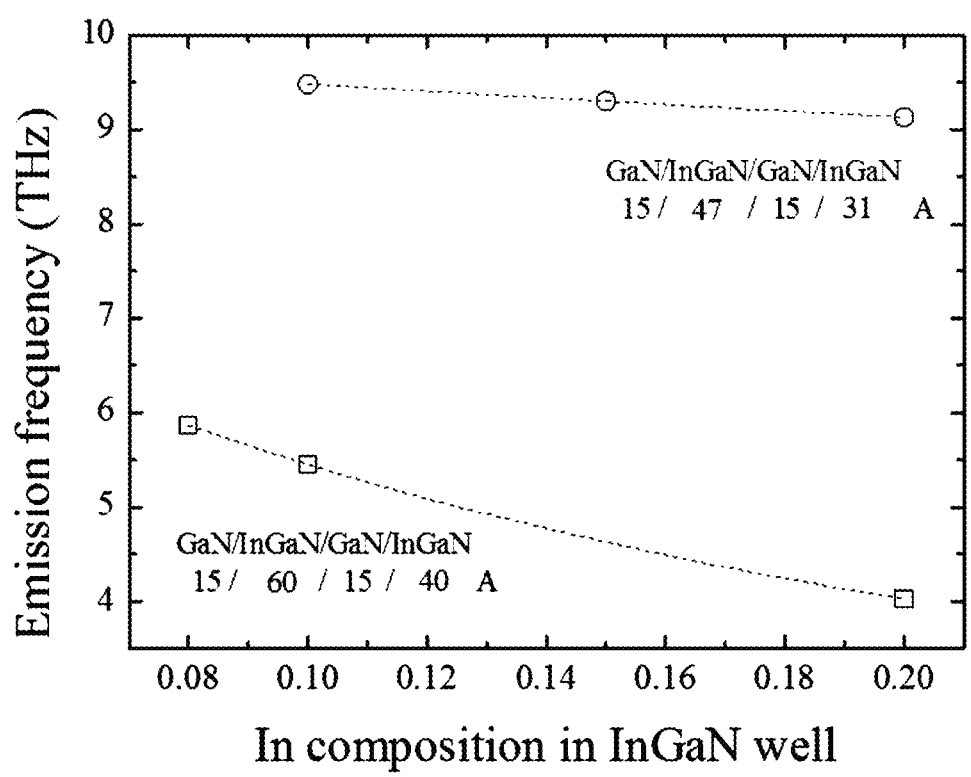
FIG. 17 is graph of calculation result showing variations in lasing frequency as a function of In composition ratio, which has an influence on the barrier height of a THz-QCL for which a GaN/InGaN material is employed in an embodiment of the present disclosure.

As shown in FIGS. 16A and 17, also with the structures in which the materials of the barrier layer and the well layer are GaN and InGaN, respectively, a THz-QCL whose lasing frequency is in a range of 4 to 9.5 THz, which partially overlaps with the unexplored frequency range, can be fabricated using a lower-level-light-emission pure-three-level structure.

Figure 18A:
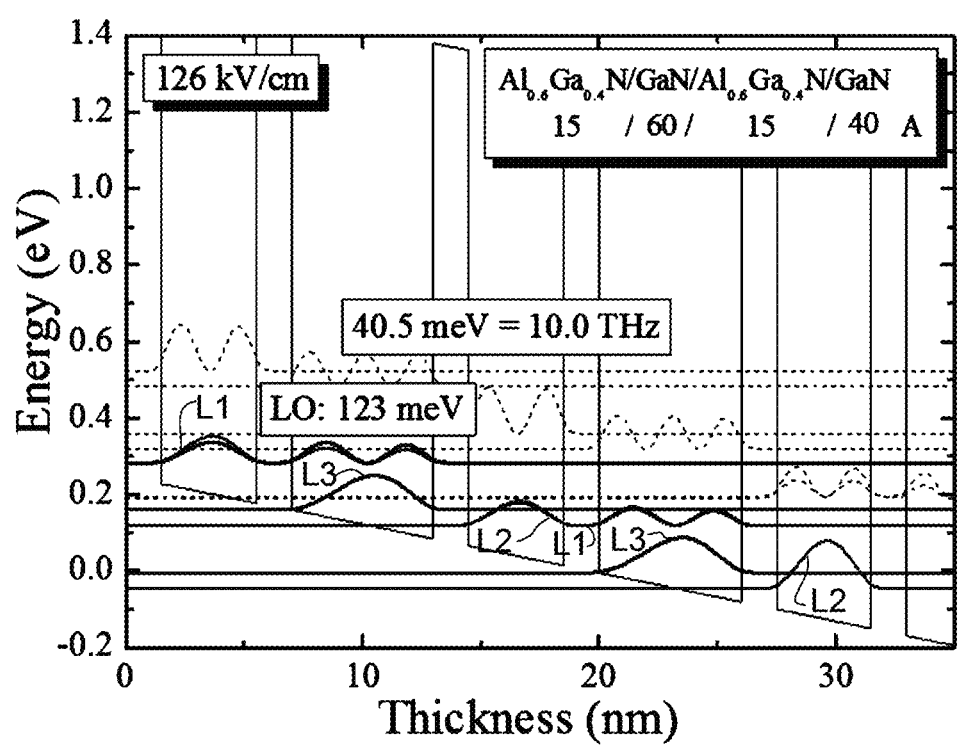
FIG. 18A is a graph showing positional dependence of electric potential and an electron probability distribution calculated from the wave function of each sub band, for structures of a THz-QCL for which a AlGaN/GaN material formed on a nonpolar plane of an AlN substrate is employed for one structure in which lasing occurs at around 10 THz, in an embodiment of the present disclosure.
Figure 18B:
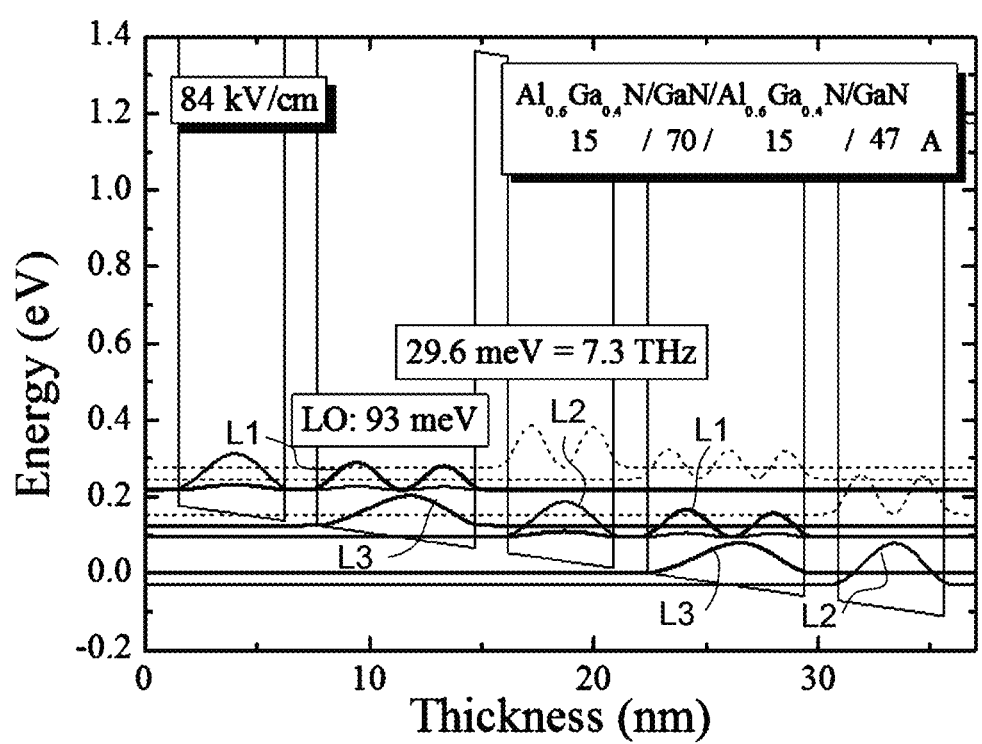
FIG. 18B is a graph showing positional dependence of electric potential and an electron probability distribution calculated from the wave function of each sub band, for structures of a THz-QCL for which a AlGaN/GaN material formed on a nonpolar plane of an AlN substrate is employed for one structure in which lasing occurs at around 7.3 THz, in an embodiment of the present disclosure.
Figure 19:
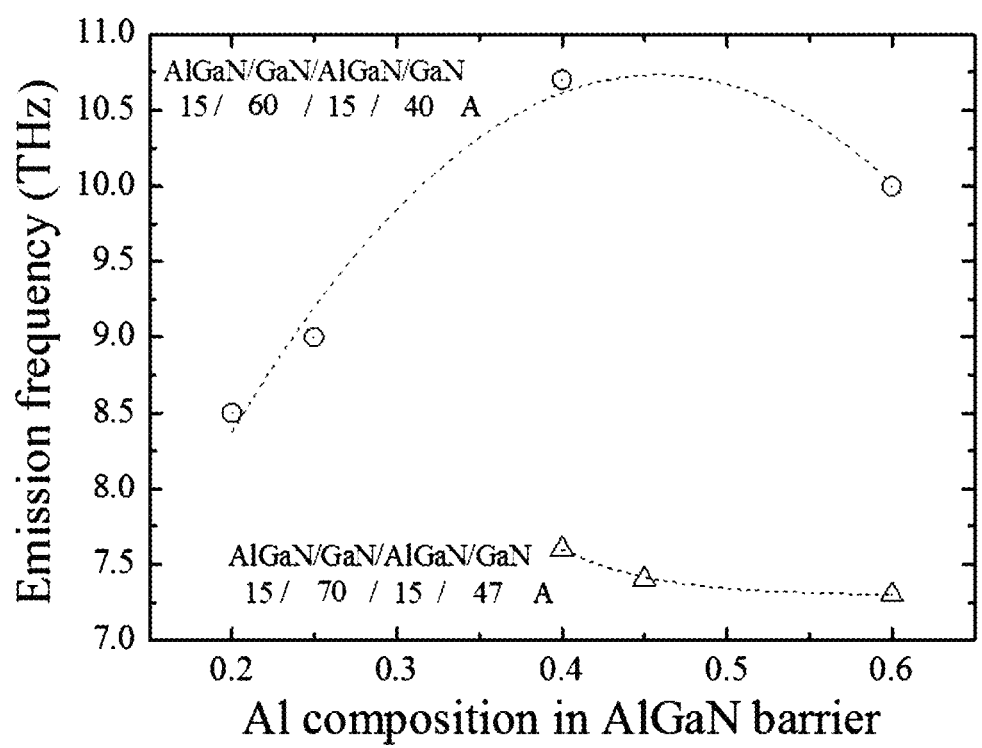
FIG. 19 is a graph of a calculation result showing variations in lasing frequency with respect to an Al composition ratio, which has an influence on the barrier height of the THz-QCL for which an AlGaN/GaN material formed on a nonpolar plane of an AlN substrate is employed in an embodiment of the present disclosure.
Figure 20A:
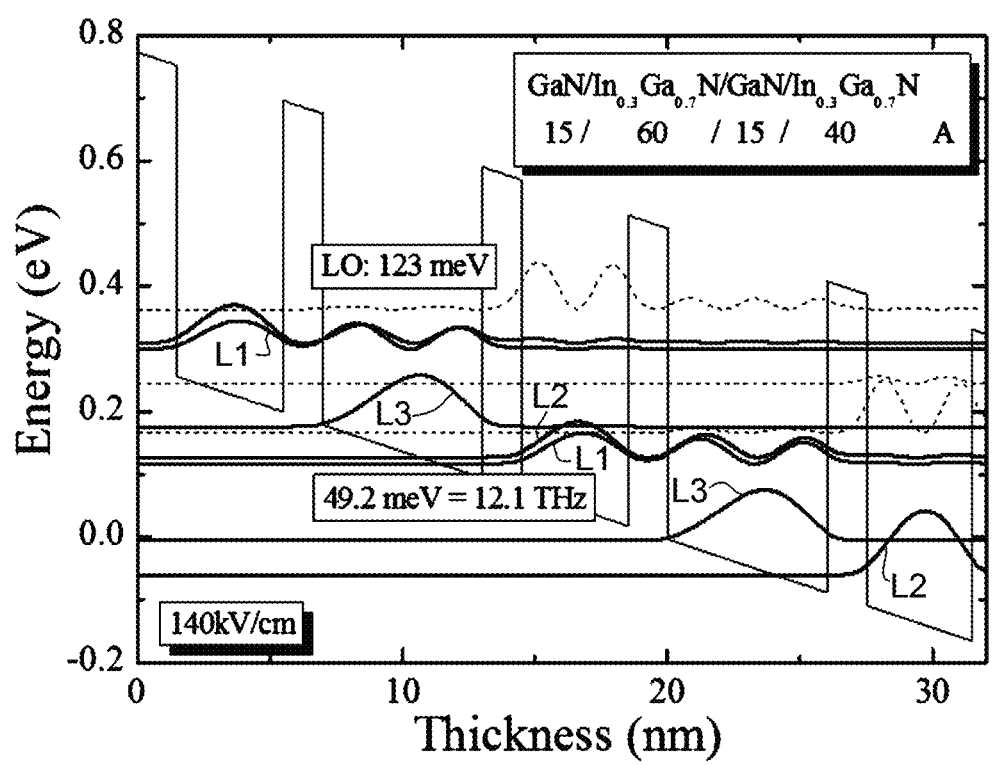
FIG. 20A is a graph showing positional dependence of electric potential and electron probability distribution calculated from the wave function of each sub band, for structures of a THz-QCL for which a GaN/InGaN material formed on a nonpolar plane of a GaN substrate is employed in a structure in which lasing occurs at around 12 THz, in an embodiment of the present disclosure.
Figure 20B:
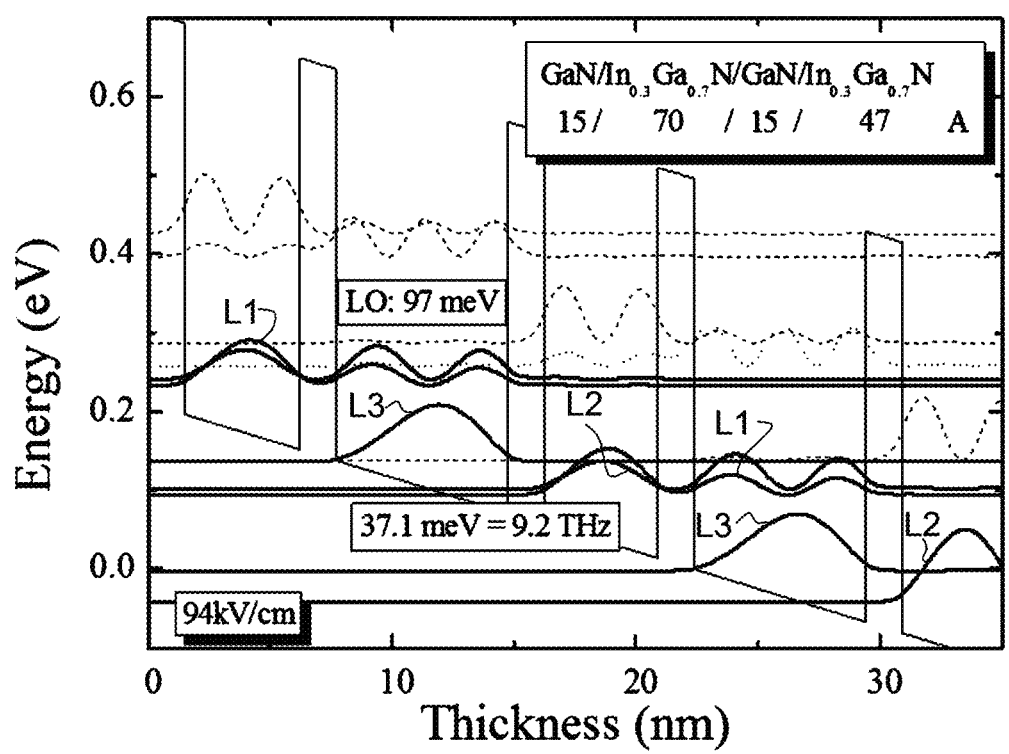
FIG. 20B is a graph showing positional dependence of electric potential and electron probability distribution calculated from the wave function of each sub band, for structures of a THz-QCL for which a GaN/InGaN material formed on a nonpolar plane of a GaN substrate is employed in a structure in which lasing occurs at around 9 THz, in an embodiment of the present disclosure.
Figure 21:
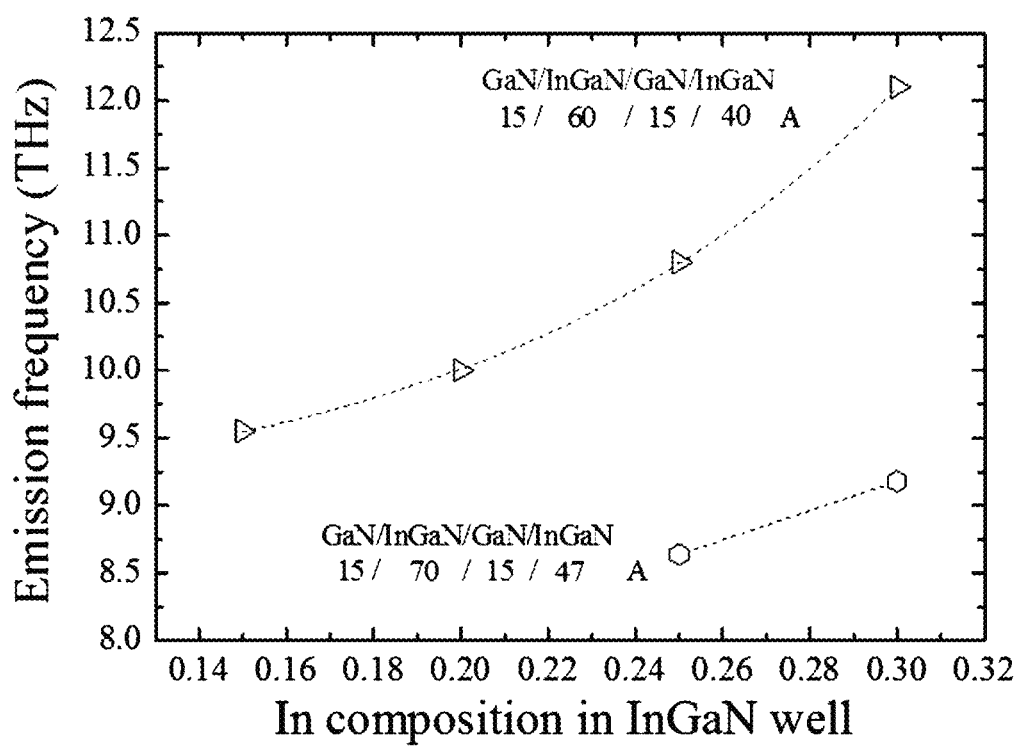
FIG. 21 is a graph of a calculation result showing variations in lasing frequency with respect to an In composition ratio, which has an influence on the barrier height of the THz-QCL for which an GaN/InGaN material formed on a nonpolar plane of an GaN substrate is employed in an embodiment of the present disclosure.

2-1-6. Application of Lower-Level-Light-Emission Pure-Three-Level Structure to Nonpolar Substrate In the above-mentioned description, there is described the structure in which a piezo-electric field appears inside a super lattice of a GaN-based material, the piezo-electric field occurring in the case where crystal growth is carried out with a polarized plane of a base material selected for a growth surface. The lower-level-light-emission pure-three-level structure in the present embodiment is applicable to a configuration without the piezo-electric field, namely, to the case where the crystal growth is carried out with a nonpolar plane of the base material selected for a growth surface. A THz-QCL for which a base material having a nonpolar plane as a surface (a nonpolar substrate) is used can be fabricated with both a material configuration in which barrier layer/well layer is AlGaN/GaN and a material configuration in which barrier layer/well layer is GaN/InGaN. FIG. 18 is a graph showing positional dependence of electric potential, and electron probability distribution calculated from the wave function of each sub band, in the structure of a THz-QCL for which a AlGaN/GaN material formed on a nonpolar plane of an AlN substrate is employed, in a structure with which lasing occurs at around 10 THz (FIG. 18A), and in a structure with which lasing occurs at around 7.5 THz (FIG. 18B). In addition, FIG. 19 is a graph showing variations in lasing frequency with respect to an Al composition ratio, which has an influence on the barrier height of the THz-QCL for which an AlGaN/GaN material formed on a nonpolar plane of an AlN substrate is employed. Furthermore, FIGS. 20A, 20B and FIG. 21 show similar graphs in the case where a GaN/InGaN material formed on a nonpolar plane of a GaN substrate is employed.

Note that an example of a nonpolar substrate in the material configuration in which the materials of the barrier layer and the well layer are AlGaN and GaN, respectively, is an AlN substrate whose surface is m-plane, and an example of a nonpolar substrate in the material configuration in which the materials of the barrier layer and the well layer are GaN and InGaN, respectively, is a GaN substrate whose surface is m-plane.

As shown in FIGS. 17 and 19, also with structures using a nonpolar substrate, it is possible to fabricate a THz-QCL whose lasing frequency is in a range of 7.5 to 10.5 THz in the case of AlGaN/GaN, or a range of 9.5 to 12 THz in the case of GaN/InGaN, which partially overlaps with the unexplored frequency range, using the lower-level-light-emission pure-three-level structure.

2-2. Upper-Level-Light-Emission Pure-Three-Level Structure

Figure 22A:
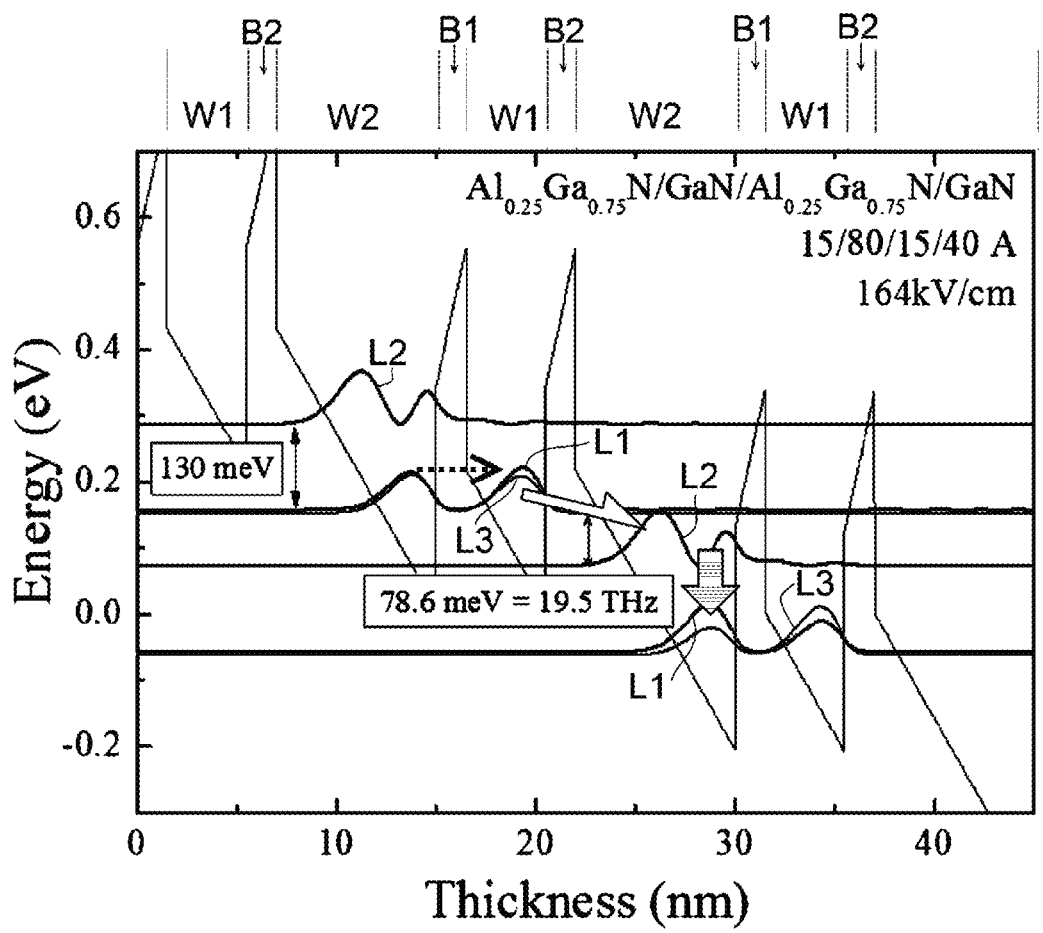
FIG. 22A is a graph of calculation result showing positional dependence of electric potential, and electron probability distribution calculated from the wave function of each sub band, in the configuration of a THz-QCL in an embodiment of the present disclosure with which lasing frequencies of 12 to 19.5 THz can be obtained.
Figure 22B:
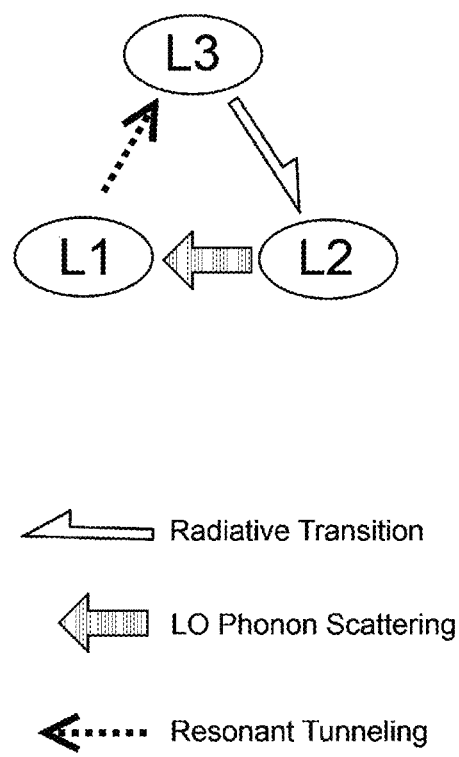
FIG. 22B is a schematic diagram of the behavior of an electron in a reduced depiction scheme, according to an embodiment of the present disclosure.

The concept of the lower-level-light-emission pure-three-level structure, for which the operation and the design are experimentally and theoretically described in detail, is applicable to other light-emission pure-three-level structures. Among structures of a THz-QCL with which it is theoretically predicted that lasing frequencies of 12 to 19.5 THz can be obtained, there is also provided one called an upper-level-light-emission pure-three-level structure. FIG. 22A is a graph showing positional dependence of electric potential, and distribution of probabilities of electron existence calculated from the wave function of each sub band, in the upper-level-light-emission pure-three-level structure, and FIGS. 23A, 23B show graphs of variations in lasing frequency with respect to composition ratio that has an influence on barrier height (FIG. 23A), and to bias electric field (FIG. 23B).

In FIG. 22A, the upper lasing level and the lower lasing level are the levels L3 and L2, respectively. However, unlike the lower-level-light-emission pure-three-level structure shown in FIGS. 5 and 8, in the well layer W1 in which the level L3 being the lower lasing level has a significant probability of existence, the other level L1 having a lower energy value also has a significant probability of existence. The level L3 in the other downstream unit, the right direction in FIG. 22A, also has a significant probability of existence in the well layer W1. In the upper-level-light-emission pure-three-level structure, the level L1 depopulates electrons from the level L2 by LO-phonon scattering. Between the levels L1 and L3 in the downstream unit, electrons are transported by RT. That is, in the upper-level-light-emission pure-three-level structure, the order of behavior of an electron is light emission, LO-phonon scattering, and RT, which differs from that in the lower-level-light-emission pure-three-level structure, which has the order of light emission, RT, and LO-phonon scattering, as shown in FIG. 5B. Therefore, the upper-level-light-emission pure-three-level structure can be a structure that eliminates a restriction that a lower level of each well layer should be selected as the upper and lower levels of the light emission, the restriction being employed in the lower-level-light-emission pure-three-level structure, although the upper-level-light-emission pure-three-level structure follows the concept of employing the two quantum well structure, which is a relatively simple structure, and reducing the number of levels as far as possible to avoid light emission between unintended levels.

Figure 23A:
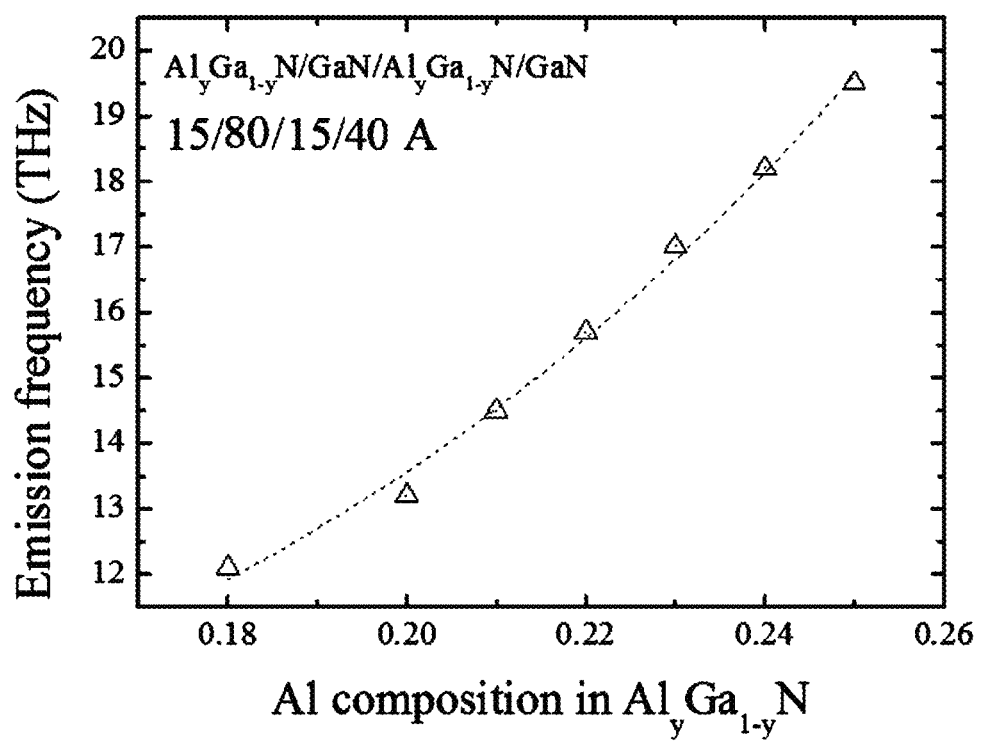
FIG. 23A is a graph of calculation result showing variations in lasing frequencies with respect to composition ratio, which has an influence on barrier height, for a THz-QCL in an embodiment of the present disclosure with which lasing frequencies of 12 to 19.5 THz can be obtained.
Figure 23B:
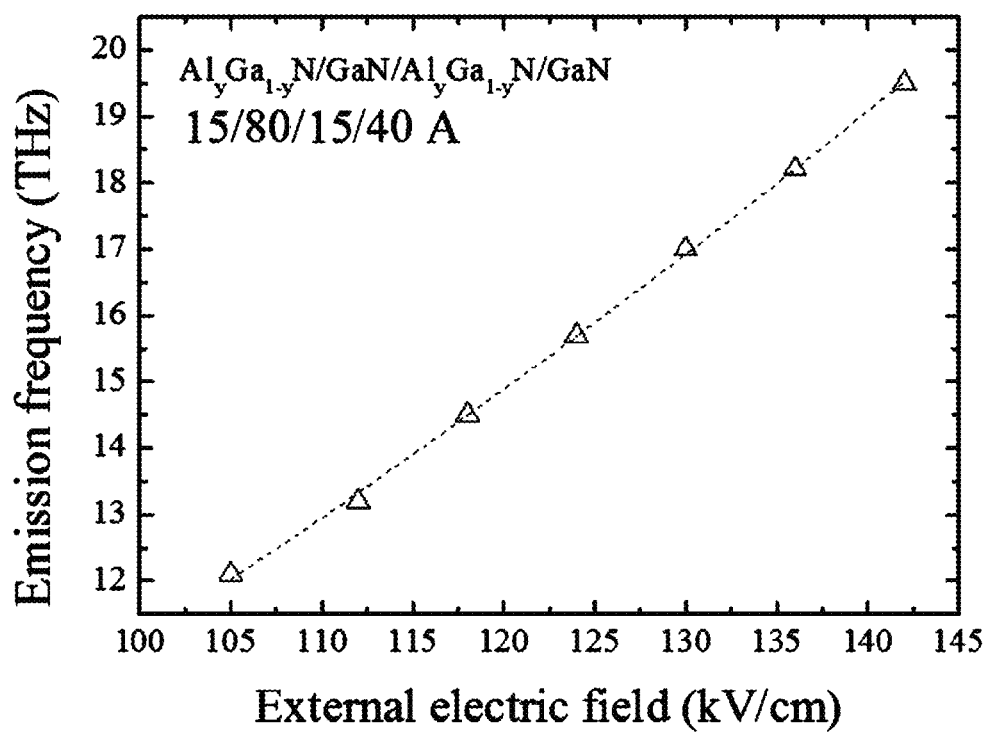
FIG. 23B is a graph of calculation result showing variations in lasing frequencies with respect to bias electric field, which has an influence on barrier height, for the THz-QCL of FIG. 23A.

As shown in FIGS. 23A, 23B, when a THz-QCL of a GaN-based material is fabricated using the upper-level-light-emission pure-three-level structure, the possibility of lasing in a wide frequency range of 12 to 19.5 THz can be expected. This frequency range is useful in that, although it is out of the unexplored frequency range, the expansion of the lasing frequency is achieved by utilizing the height of LO-phonon energy of a GaN-based material e.g., 90 meV, or 22 THz.

Figure 24A:
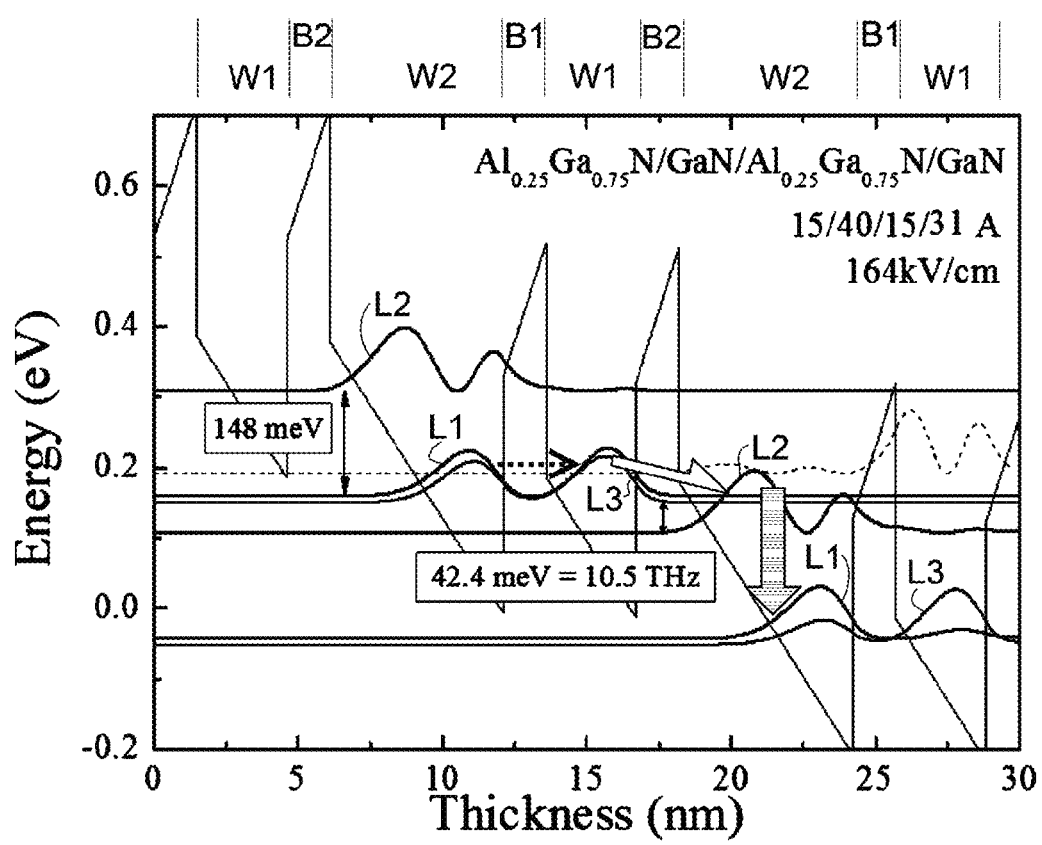
FIG. 24A is a graph showing positional dependence of electric potential and electron probability distribution calculated from the wave function of each sub band, for structures of a THz-QCL in an embodiment of the present disclosure with which lasing frequencies of 7 to 10.5 THz can be obtained.
Figure 24B:
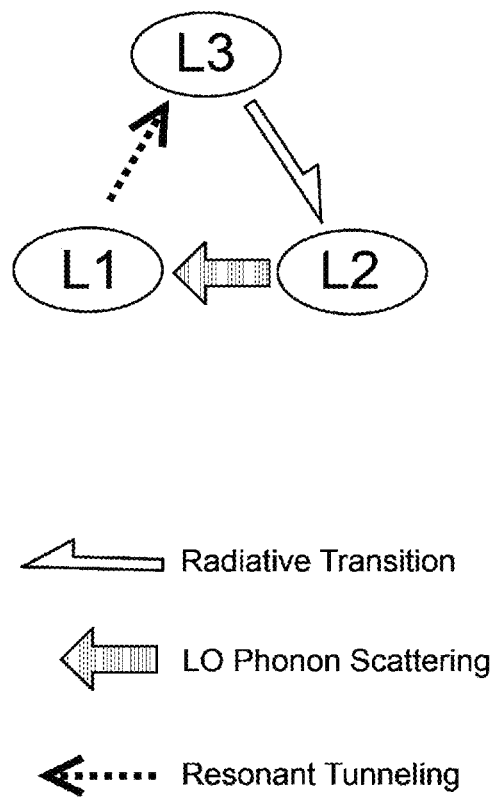
FIG. 24B is a schematic diagram of the behavior of an electron in a reduced depiction scheme according to the embodiment shown in FIG. 24A.
Figure 25A:
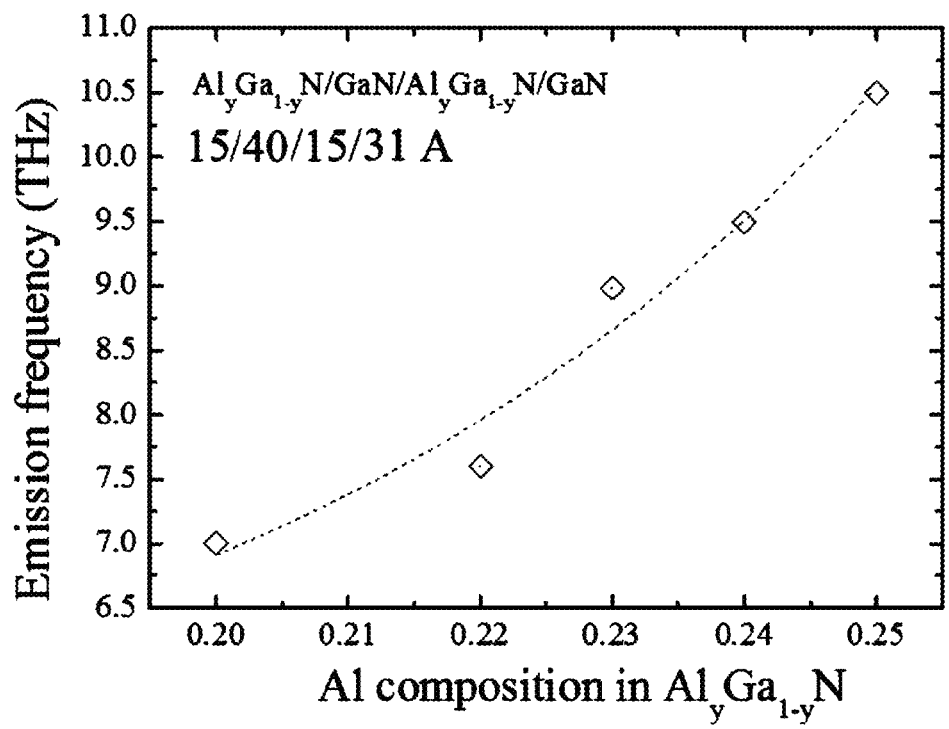
FIG. 25A is a graph of a calculation result indicating variations in lasing frequency with respect to composition ratio that has an influence on barrier height for a THz-QCL in an embodiment of the present disclosure with which lasing frequencies of 7 to 10.5 THz can be obtained.
Figure 25B:
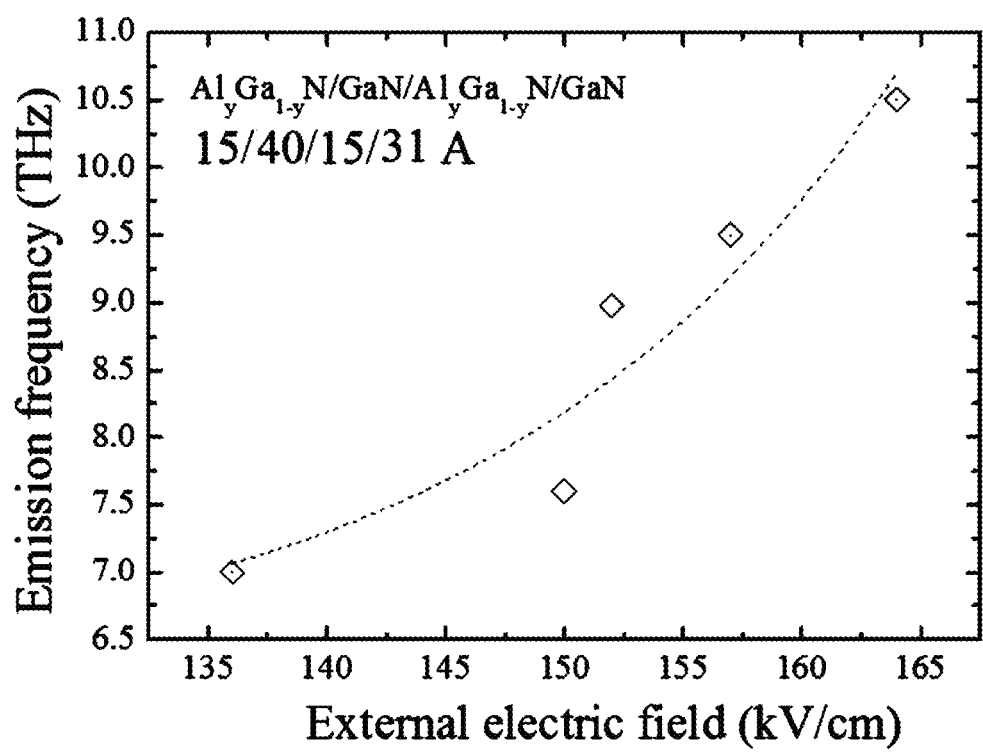
FIG. 25B is a graph of a calculation result indicating variations in lasing frequency with respect to bias electric field that has an influence on barrier height for a THz-QCL according to the embodiment of FIG. 25A.

The upper-level-light-emission pure-three-level structure is applicable to not only the operation at frequencies of 12 THz or over. FIGS. 24A and 25A show structures with which a lasing frequency can be obtained in a range of 7 to 10.5 THz. That is, with the upper-level-light-emission pure-three-level structure, as compared to that shown in FIGS. 22A and 23A, B, it is possible to fabricate a THz-QCL whose lasing frequency is in a range of 7 to 10.5 THz by employing a structure of layers in which the thickness of the well layer is small. In addition, the thickness of the well layer can be changed by changing the deposition condition, and it is thus possible to fabricate a THz-QCL that covers a frequency range of 10.5 to 12 THz only by slightly changing the design of a structure of films.

3. Embodiment 2

In Embodiment 1 mentioned above, the pure-three-level structure of the lower-level light emission type or the upper-level light emission type is described. The two quantum well structure being a simple configuration has been employed there, and the number of levels participating in the light emission has been limited to three. However, with an appropriate design and an ensured precision in fabrication in accordance with such design, it is possible to employ an advanced structure in exchange for sacrificing the simplicity. The advancement at that point aims at the enhancement of reliability of population inversion. In Embodiment 2 of the present application, the transport and the depopulation of electrons described in Embodiment 1 in conjunction with the action of the mediation level, which are separate actions targeting separate levels, are allocated to dedicated levels. Since the number of levels is increased by one, this sub band structure is referred to as a pure-four-level structure. To realize the pure-four-level structure, a three quantum well structure is employed by increasing the number of quantum wells in a unit by one.

Figure 26A:
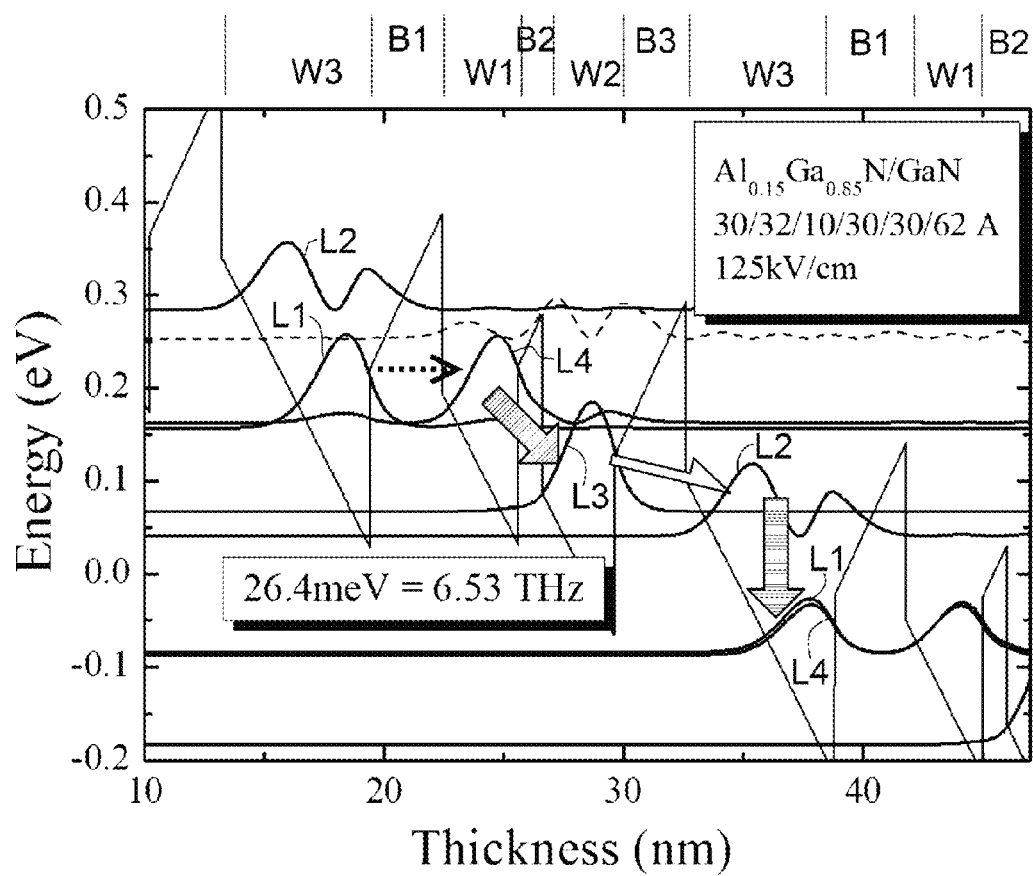
FIG. 26A is a graph of a calculation result showing positional dependence of electric potential, and electron probability distribution calculated from the wave function of each sub band, for a structure of a THz-QCL in an embodiment of the present disclosure with which lasing frequencies near 6 THz can be obtained.
Figure 26B:
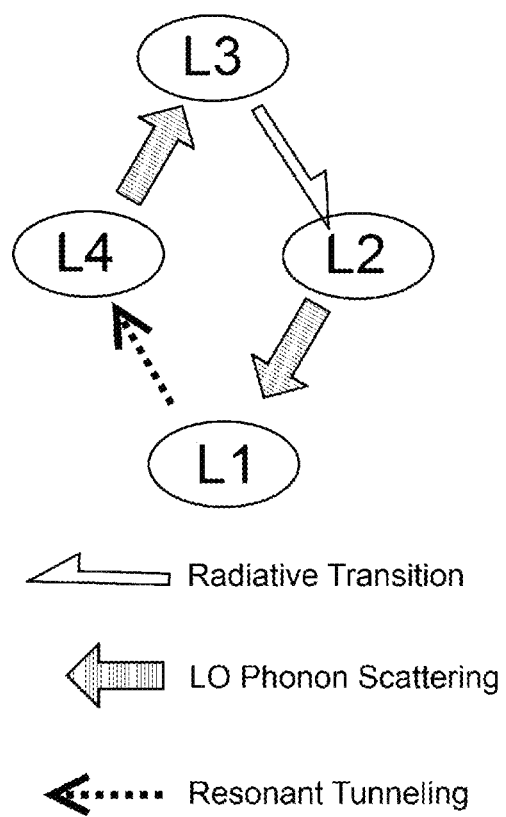
FIG. 26B is a schematic diagram of the behavior of an electron in a reduced depiction scheme according to the embodiment of FIG. 26A.

FIG. 26A is a graph of a calculation result showing positional dependence of electric potential, and electron probability distribution calculated from the wave function of each level (each sub band), in the structure of a THz-QCL which may have lasing frequency of around 6 THz. The upper lasing level and the lower lasing level are the levels L3 and L2, respectively. The lasing frequency brought by the levels is predicted to be 6.53 THz. The level L2 has a significant probability of existence in a well layer W3. In the well layer W3, the level L1, which is below the level L2, also has a significant probability of existence. This level L1 is a level that depopulates electrons from the level L2 by LO-phonon scattering. The description thus far is the same as the description about the upper-level-light-emission pure-three-level structure with reference to FIG. 22A. In the pure-four-level structure, as shown in FIG. 26A, a level L4 is formed further above the level L3, being the upper lasing level. The level L4 has a significant probability of existence in the well layer W1, and plays a role of a transport level to transport electrons to the level L3 by LO-phonon scattering. FIG. 26B shows the behavior of electrons in a reduced depiction scheme.

Under a bias electric field for the operation, electrons at the level L4 being the transport level in each unit are scattered by LO-phonons to make a transition to the level L3. Electrons at the level L3 makes a transition to the level L2 through stimulated emission. At that point, the electrons emit electromagnetic waves each having a photon energy that is equivalent to the energy difference between the levels L3 and L2. Electrons at the level L2 are scattered by LO-phonons to make a transition to the level L1. Then, electrons at the level L1 pass through the barrier layer B1 of another unit adjacent on the downstream side through resonant tunneling conduction and are transported to the level L1 of the downstream side unit.

4. Embodiment 3

In addition to Embodiments 1 and 2 mentioned above, it is useful to employ, in exchange for further complication, a further advanced structure to enhance the reliability of population inversion. In an embodiment, in addition to the transport level and the depopulation level described in an embodiment (the pure-four-level structure), a level called an injection level is formed between the transport level and the upper lasing level. The structure of this super lattice has a three quantum well structure that is similar to that in an embodiment, called an indirect pumping promoting type. In an embodiment, this indirect pumping promoting type is employed.

Figure 27A:
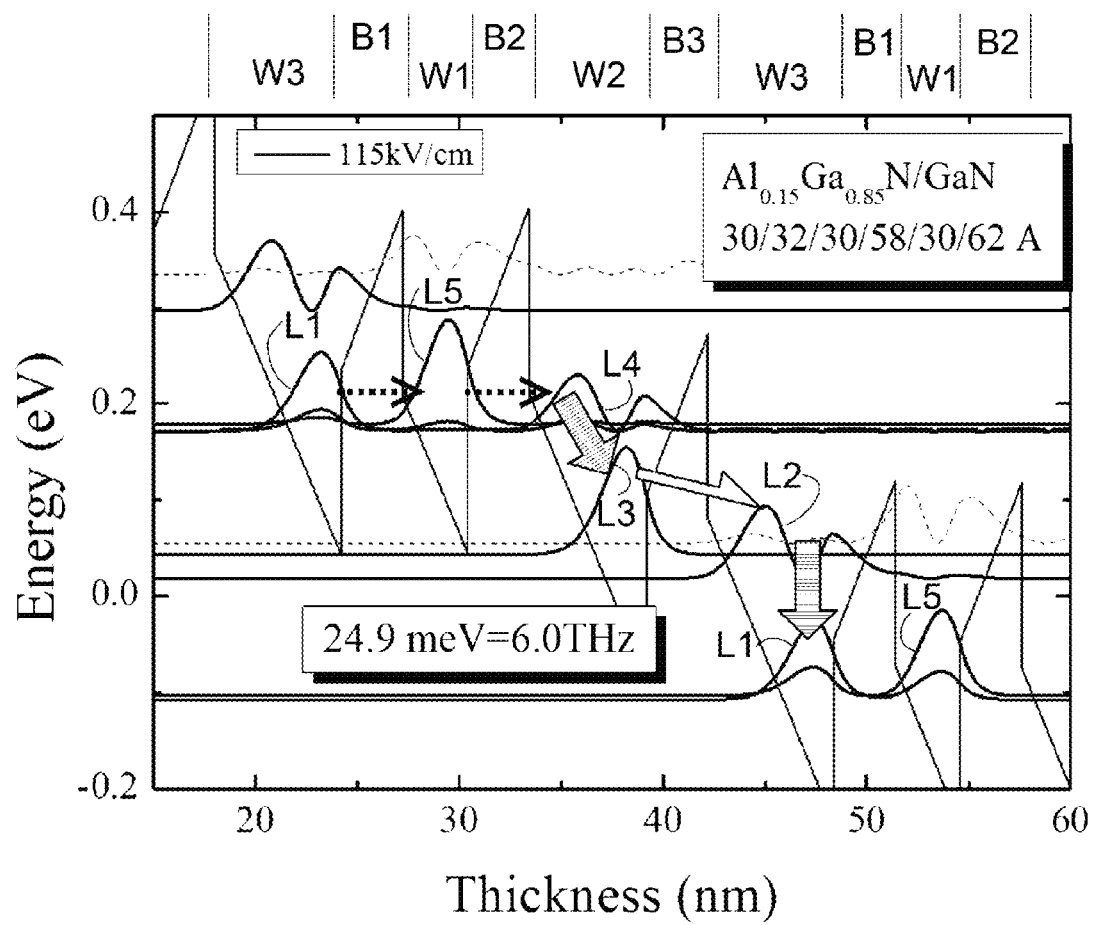
FIG. 27A is a graph of calculation result showing positional dependence of electric potential, and electron probability distribution calculated from the wave function of each sub band, for a structure of a THz-QCL in an embodiment of the present disclosure with which lasing frequencies near 6 THz can be obtained.
Figure 27B:
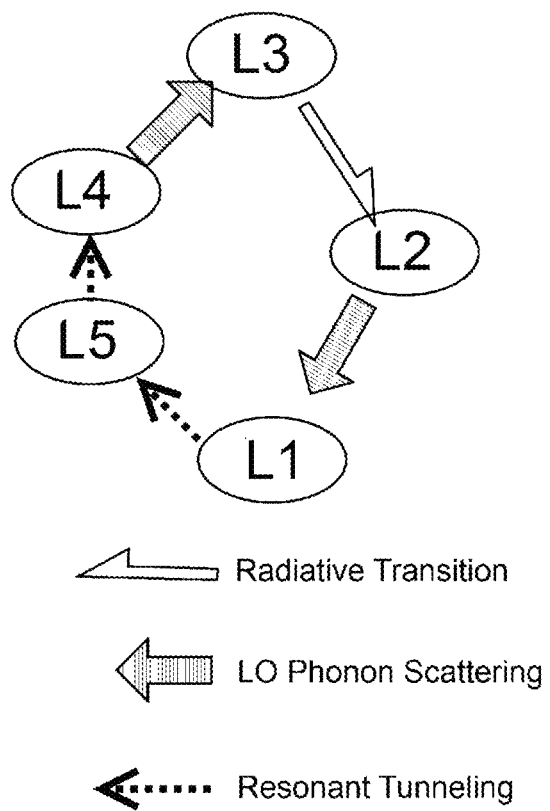
FIG. 27B is a schematic diagram of the behavior of an electron in a reduced depiction scheme according to the embodiment of FIG. 27A.

FIGS. 27A,B are graphs of calculation results showing positional dependence of electric potential, and an electron probability distribution calculated from the wave function of each sub band, in the structure of a THz-QCL with which a lasing frequency can be obtained at around 6 THz. The upper lasing level and the lower lasing level are the levels L3 and L2, respectively. The lasing frequency brought by the levels is predicted to be 6.0 THz. The relationship and the interaction between the levels L2 and L1 are the same as those in Embodiment 2, the pure-four-level structure. In Embodiment 3, the level L4 is interposed between a level L5 and the level L3. The level L4 has a significant probability of existence in the well layer W2, as with the level L2 being the upper lasing level. For this reason, in the indirect pumping promoting type in Embodiment 3, the level L4 plays a role of the injection level that injects electrons into the level L3 by LO-phonon scattering. The overlap integral between the levels L4 and L3 can be increased as compared with the case in Embodiment 2, and it is thus possible to significantly enhance the injection efficiency into the level L3 that is to be an upper lasing level. That is, the indirect pumping promoting type in Embodiment 3 can be considered as a form in which a wave function found in the well layer W2 in Embodiment 2 shown by a dotted line in FIG. 26 is brought by design at the same height as a level that has a significant probability of existence in the well layer W1 e.g., the level L4 in FIGS. 26A,B and the level L5 in FIGS. 27A,B, being a structure that significantly enhances the injection efficiency. It should be noted that the transport level in an embodiment is the level L5.

In the THz-QCL in an embodiment, under a bias electric field for the operation, electrons at the level L5 in each unit are transported to the level L4 by resonant tunneling conduction by which the electrons pass through the barrier layer B2. Electrons at the level L4 are scattered by LO-phonon to make a transition to the level L3. Electrons at the level L3 make a transition to the level L2 through stimulated emission. At that point, the electrons emit electromagnetic waves each having a photon energy that is equivalent to the energy difference between the levels L3 and L2. Electrons at the level L2 are scattered by LO-phonons to make a transition to the level L1, and electrons at the level L1 pass through the barrier layer B1 of another unit on the downstream side through resonant tunneling conduction and are transported to the level L5 of the downstream side unit.

5. Lasing at Low Frequency by Pure-Three-Level-System QCL

Figure 28:
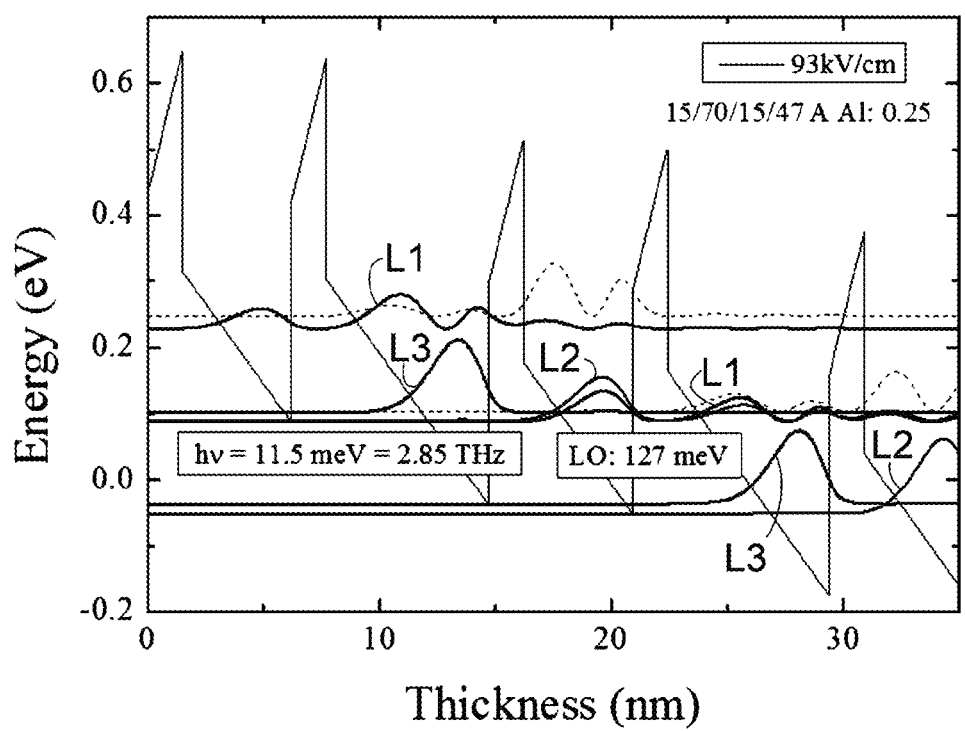
FIG. 28 is a graph of a calculation result on a structural example for lasing operation at a low frequency in a pure-three-level-system QCL in an embodiment of the present disclosure, showing positional dependence of electric potential, and an electron probability distribution calculated from the wave function of each sub band, for a structure of a THz-QCL with which lasing frequencies of 1.8 to 4.3 THz are obtained.
Figure 29A:
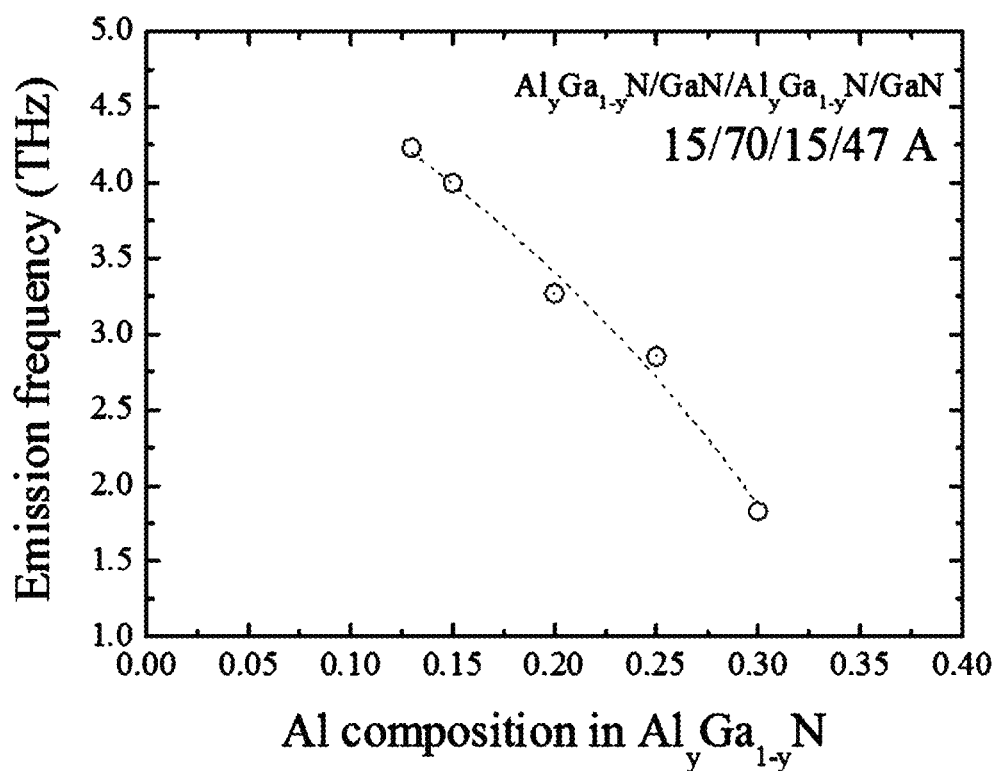
FIG. 29A shows graphs of calculation results indicating variations in lasing frequency with respect to composition ratio that has an influence on barrier height for a THz-QCL with which lasing frequencies of 1.8 to 4.3 THz are obtained, for a structural example in which a pure-three-level-system QCL for lasing operation in a similar manner to that shown in FIG. 28.
Figure 29B:
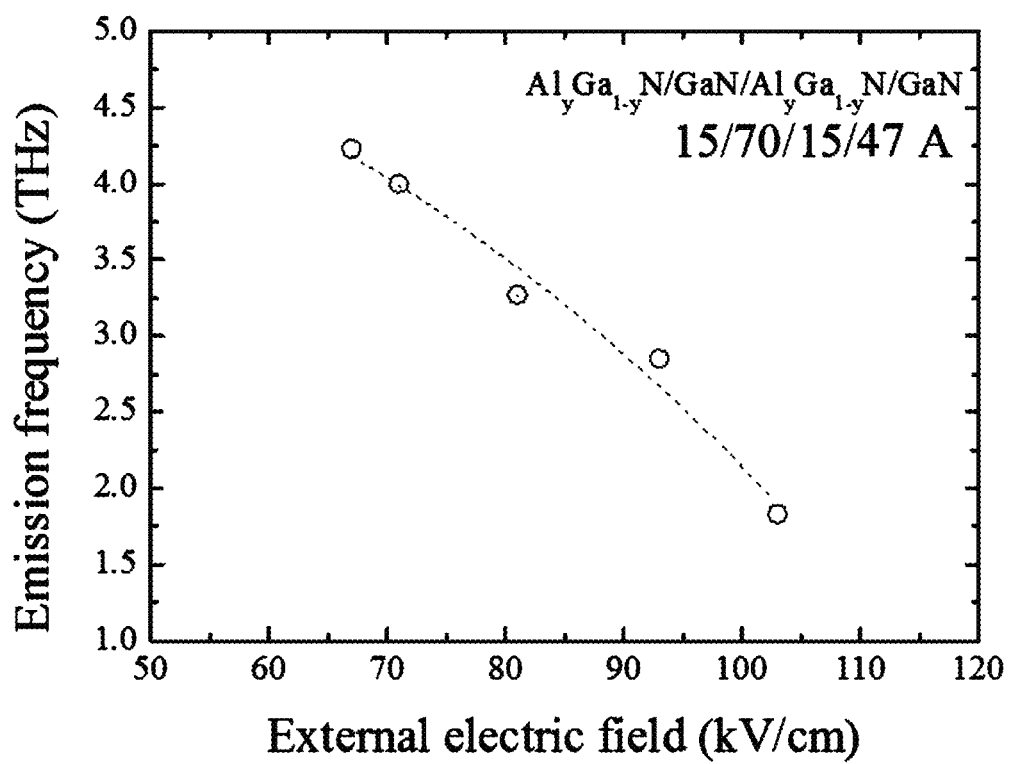
FIG. 29B shows graphs of calculation results indicating variations in lasing frequency with respect to bias electric field that has an influence on barrier height for a THz-QCL with which lasing frequencies of 1.8 to 4.3 THz are obtained, for a structural example in which a pure-three-level-system QCL for lasing operation in a similar manner to that shown in FIG. 28.

The design concept for the pure-three-level structure in an embodiment mentioned above (the lower-level-light-emission pure-three-level structure, see 2-1) can be employed for frequencies that are not in the unexplored frequency range. FIG. 28 is a graph of a calculation result on a configuration example in which a pure-three-level-system QCL is subjected to lasing at a low frequency, showing positional dependence of electric potential, and electron probability distribution calculated from the wave function of each sub band, in the structure of a THz-QCL that may have lasing frequencies of 1.8 to 4.3 THz. In addition, FIGS. 29A, 29B show graphs of variations in lasing frequency with respect to composition ratio that has an influence on barrier height (FIG. 29A), and to bias electric field (FIG. 29B). Also in the case of employing a GaN-based material to realize lasing operation at 1.8 to 4.2 THz, a high energy value of LO-phonons is useful to realize lasing operation at high temperature.

6. Supplement of Knowledge

Through the embodiments in which the description is made from both perspectives of experiment and theoretical calculation, the following knowledge is obtained mainly about the lasing operation in the unexplored frequency range.

6-1. Polarized Plane of Crystal Lattice and Bias Electric Field

In the embodiments of the present disclosure, there are described the configurations of formation on a polarized plane of the crystal lattice of a base material, where a piezoelectric field occurs, except for FIGS. 2A, B that give a general description and FIGS. 18A to 21 in which a nonpolar substrate is used. The same is true for the THz-QCLs with which lasing operation is observed through experiment. In all of these descriptions and experiments, the direction of a bias electric field that gives an overall gradient to the potential of conduction-band electrons by external voltage may be a direction in which the direction of the potential gradient in each well layer is enhanced. In this regard, for example, in a conventional super lattice disclosed in Patent Literature 1 that uses a polarized plane, the above relationship between the potential gradient and the bias electric field is not disclosed. Note that the direction of the bias electric field is designed to be a direction along which a gradient of potential in each well layer is enhanced, and that operation under a bias electric field in the opposite direction thereof may be an advantageous alternative. For example, in a design that enables light emission with high efficiency, it is possible to employ a direction of the bias electric field along which the potential gradient in each well layer is reduced.

6-2. Peak of Probability of Existence and Energy Value

In general, if a certain well layer accommodates therein a plurality of levels having significant probabilities of existence, a level having only one peak of probability of existence in the well layer, out of the levels, gives the lowest energy value or an energy value equivalent thereto. In addition, if there is a level that has two peaks of probability of existence in the well layer, the energy of the level has a high energy value as compared with the lowest energy value or an energy value equivalent thereto. In this regard, referring to the description in the above-mentioned embodiments, the upper lasing level does not have two peaks of probability of existence but one peaks of probability of existence in one well layer in all cases. That is, the upper lasing level is a level having the lowest energy value of a well layer in which electrons are found with high probabilities or an energy value equivalent thereto.

In contrast, the lower lasing level depends on a specific level structure and does not necessarily have the lowest energy value or an energy value equivalent thereto. For example, in the lower-level-light-emission pure-three-level structure (2-1), the lower lasing level has only one peak in a well layer in which the lower lasing level has a significant probability of existence and gives the lowest energy in the well layer or an energy equivalent thereto. In contrast, in the upper-level-light-emission pure-three-level structure (2-2), the lower lasing level has two peaks in a well layer in which the lower lasing level has a significant probability of existence and does not have the lowest energy or an energy equivalent thereto.

For this reason, it can be considered that the sub band structures in the above embodiments prevent an adverse effect on population inversion that a lower level existing in a single well layer in which an upper lasing level is bound and having a significant probability of existence brings about leakage that cancels population inversion. Note that a lower lasing level has no adverse effect on population inversion if a lower level exists in the same well layer, and if the lower level has a function of depopulating electrons from the lower lasing level, it has a good effect on population inversion.

6-3. Thicknesses of Well Layers

The thicknesses of well layers, in particular, the balance of thickness of well layers in which both of an upper lasing level and a lower lasing level have significant probabilities of existence depends on whether the above-mentioned lower lasing level becomes the minimum energy level. In the lower-level-light-emission pure-three-level structure (2-1), the upper lasing level and the lower lasing level are positioned in a thicker well layer and thinner well layer, respectively. This relationship is reversed in the upper-level-light-emission pure-three-level structure (2-2). Note that the thickness relationship is resulted from the design to realize an objective energy value and operation in each level, and thus the same may not be true depending on materials or the values of bias electric field.

6-4. Diagonal Transition

In any embodiment of the present application, the relationship in transition between the upper lasing level and the lower lasing level is a relationship in which the both levels have significant probabilities of existence in different well layers. For this reason, the center of mass of an electron moves at the time of a transition from the upper lasing level to the lower lasing level. Such a transition is called a diagonal transition. In any embodiment of the present application, a transition from the upper lasing level to the lower lasing level is a diagonal transition.

It will be appreciated that, although specific embodiments of the present disclosure are described herein for purposes of illustration, various modifications may be made without departing from the spirit and scope of the present disclosure. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. Aspects of the embodiments can be modified, if necessary, to employ concepts of the various patents, applications and publications to provide yet further embodiments.

The present disclosure can be used in any apparatus that uses an electromagnetic-wave source of a THz range.

What is claimed is:

1. A quantum cascade laser element comprising:
   a super lattice formed by a crystal of a nitride semiconductor;
   the super lattice having a plurality of unit structures, each of which includes
   a first barrier layer;
   a first well layer stacked on the first barrier layer;
   a second barrier layer stacked on the first well layer; and
   a second well layer stacked on the second barrier layer, the barrier layers and the well layers having high and low potentials, respectively, relative to potentials of conduction-band electrons of the crystal,
   each unit structure including an energy level structure for electrons under a bias electric field in a stacking direction due to external voltage, the energy level structure having:
   a mediation level that has a significant probability of finding an electron in at least one of the first well layer and the second well layer;
   an upper lasing level that has a significant probability of finding an electron in the first well layer; and
   a lower lasing level that has a significant probability of finding an electron in the second well layer,
   under the bias electric field, an energy value of the mediation level being close to an energy value of either the upper lasing level or the lower lasing level of one or more of the unit structure or another unit structure adjacent thereto, and is separated from an energy value of the other level by at least an energy value of a longitudinal-optical (LO) phonon of the crystal, and
   the energy value of the LO-phonon being greater than a photon energy for an electromagnetic wave emitted by stimulated emission from an electron that makes a transition from the upper lasing level to the lower lasing level in response to the bias electric field.

2. The quantum cascade laser element according to claim 1, wherein, under the bias electric field, the mediation level has a significant probability of finding an electron in the first well layer, and
   wherein, under the bias electric field, the quantum cascade laser element operates in such a manner that
   an electron at a mediation level in each unit structure is scattered by an LO-phonon of the crystal to make a transition to an upper lasing level,
   an electron at an upper lasing level in each unit structure emits the electromagnetic wave when making a transition to a lower lasing level through stimulated emission, and
   an electron at a lower lasing level in each unit structure is transported, by resonant tunneling conduction by which the electron passes through a first barrier layer of another unit structure, to a mediation level of the other unit structure, the other unit structure being adjacent to the each unit structure on a downstream side for electrons.

3. The quantum cascade laser element according to claim 2, wherein the first well layer has a thickness larger than a thickness of the second well layer.

4. The quantum cascade laser element according to claim 1, wherein the nitride semiconductor is any one of:
a combination in which the first barrier layer and the second barrier layer are AlGaN, and the first well layer and the second well layer are GaN; and
a combination in which the first barrier layer and the second barrier layer are GaN, and the first well layer and the second well layer are InGaN.

5. The quantum cascade laser element according to claim 2, wherein a frequency of the electromagnetic wave is within a range of 4.0 to 12.0 THz.

6. The quantum cascade laser element according to claim 1, wherein, under the bias electric field, the mediation level has a significant probability of finding an electron in the second well layer, and
wherein, under the bias electric field, the quantum cascade laser element operates in such a manner that
an electron at a mediation level in an adjacent unit structure on an upstream side for electrons in each unit structure makes a transition to an upper lasing level by resonant tunneling conduction by which the electron passes through the first barrier layer,
an electron at an upper lasing level in each unit structure emits the electromagnetic wave when making a transition to a lower lasing level through stimulated emission, and
an electron at a lower lasing level in each unit structure is scattered by an LO-phonon of the crystal to make a transition to a mediation level.

7. The quantum cascade laser element according to claim 6, wherein a frequency of the electromagnetic wave that is emitted by stimulated emission from the electron making a transition from the upper lasing level to the lower lasing level is within a range of 7.0 to 19.5 THz.

8. The quantum cascade laser element according to claim 1, wherein the super lattice is formed on a nonpolar plane of a crystal of a base material.

9. A quantum cascade laser element comprising a super lattice formed by a crystal of a nitride semiconductor,
the super lattice including a plurality of unit structures,
each unit structure including
a first barrier layer;
a first well layer stacked on the first barrier layer;
a second barrier layer stacked on the first well layer;
a second well layer stacked on the second barrier layer;
a third barrier layer stacked on the second well layer; and
a third well layer stacked on the third barrier layer, the barrier and well layers having high and low potentials, respectively, relative to conduction-band electrons,
each unit structure including an energy level structure for electrons under a bias electric field in a stacking direction due to external voltage the energy level structure having:
a transport level that has a significant probability of finding an electron in the first well layer;
an upper lasing level that has a significant probability of finding an electron in the second well layer, the upper lasing level having an energy value lower than the transport level by at least an energy value of a longitudinal-optical (LO) phonon of the crystal;
a lower lasing level that has a significant probability of finding an electron in the third well layer; and
a depopulation level that has a significant probability of finding an electron in the third well layer, the depopulation level having an energy value lower than an energy value of the lower lasing level by at least an energy value of the LO-phonon, the energy value of the LO-phonon being greater than a photon energy for an electromagnetic wave.

10. The quantum cascade laser element according to claim 9,
wherein the quantum cascade laser element operates in such a manner that, under the bias electric field,
an electron at a transport level in each unit structure is scattered by an LO-phonon of the crystal to make a transition to an upper lasing level,
an electron at an upper lasing level in each unit structure emits an electromagnetic wave at a certain frequency when making a transition to a lower lasing level through stimulated emission,
an electron at a lower lasing level in each unit structure is scattered by an LO-phonon of the crystal to make a transition to a depopulation level, and
an electron at a depopulation level in each unit structure is transported, by resonant tunneling conduction by which the electron passes through a first barrier layer of another unit structure, to an transport level of the other unit structure, the other unit structure being adjacent to the each unit structure on a downstream side for electrons.

11. A quantum cascade laser element comprising a super lattice formed by a crystal of a nitride semiconductor,
wherein the super lattice includes a plurality of unit structures,
each unit structure including:
a first barrier layer;
a first well layer stacked on the first barrier layer;
a second barrier layer stacked on the first well layer;
a second well layer stacked on the second barrier layer;
a third barrier layer stacked on the second well layer; and
a third well layer stacked on the third barrier layer, the barrier and well layers having high and low potentials, respectively, relative to conduction-band electrons, a first barrier layer; each unit structure including an energy level structure for electrons under a bias electric field in a stacking direction due to external voltage, the energy level structure having:
a transport level that has a significant probability of finding an electron in the first well layer;
an injection level that has a significant probability of finding an electron in the second well layer;
an upper lasing level that has a significant probability of finding an electron in the second well layer, the upper lasing level having an energy value lower than the injection level by at least an energy value of a longitudinal-optical (LO) phonon that is exhibited by the crystal;
a lower lasing level that has a significant probability of finding an electron in the third well layer; and
a depopulation level that has a significant probability of finding an electron in the third well layer, the depopulation level having an energy value lower than the lower lasing level by at least an energy value of the LO-phonon,
the energy value of the LO-phonon being greater than the photon energy for an electromagnetic wave.

12. The quantum cascade laser element according to claim 11,
wherein the quantum cascade laser element operates in such a manner that, under the bias electric field,
wherein an electron at a transport level in each unit structure is transported to an injection level by resonant tunneling conduction by which the electron passes through a second barrier layer, wherein an electron at an injection level in each unit structure is scattered by an LO-phonon of the crystal to make a transition to an upper lasing level, wherein an electron at an upper lasing level in each unit structure emits an electromagnetic wave at a certain frequency when making a transition to a lower lasing level through stimulated emission, wherein an electron at a lower lasing level in each unit structure is scattered by an LO-phonon of the crystal to make a transition to a depopulation level, and wherein an electron at a depopulation level in each unit structure is transported, by resonant tunneling conduction by which the electron passes through a first barrier layer of another unit structure, to an transport level of the other unit structure, the other unit structure being adjacent to the each unit structure on an electron downstream side.

13. The quantum cascade laser element according to claim 1 wherein the super lattice is formed on a polarized plane of a crystal of a base material.

14. The quantum cascade laser element according to claim 13, wherein a direction of the bias electric field is a direction in which a gradient of potential along the stacking direction is enhanced, the potential acting on an electron in each well layer.

15. The quantum cascade laser element according to claim 1, wherein the super lattice is formed on a polarized plane of a crystal of another layer formed on a polarized plane of a crystal of a base material, wherein the base material is a sapphire substrate, and wherein the other layer includes an AlN layer grown by an alternate pulsed supply technique in an MOCVD technique.

16. The quantum cascade laser element according to claim 15, wherein the super lattice includes a crystal of GaN-based material grown by a DETA technique in an MBE technique.

17. The quantum cascade laser element according to claim 1, wherein the super lattice is formed on a nonpolar plane of a crystal of another layer formed on the nonpolar plane of the crystal of the base material.

18. The quantum cascade laser element according to claim 9 wherein the super lattice is formed on a polarized plane of a crystal of a base material.

19. The quantum cascade laser element according to claim 9 wherein the super lattice is formed on a polarized plane of a crystal of another layer formed on the polarized plane of the crystal of the base material.

20. The quantum cascade laser element according to claim 11 wherein the super lattice is formed on a polarized plane of a crystal of a base material.

21. The quantum cascade laser element according to claim 11 wherein the super lattice is formed on a polarized plane of a crystal of another layer formed on the polarized plane of the crystal of the base material.

22. The quantum cascade laser element according to claim 9 wherein the super lattice is formed on a polarized plane of a crystal of another layer formed on a polarized plane of a crystal of a base material, wherein the base material is a sapphire substrate, and wherein the other layer includes an AlN layer grown by an alternate pulsed supply technique in an MOCVD technique.

23. The quantum cascade laser element according to claim 11 wherein the super lattice is formed on a polarized plane of a crystal of another layer formed on a polarized plane of a crystal of a base material, wherein the base material is a sapphire substrate, and wherein the other layer includes an AlN layer grown by an alternate pulsed supply technique in an MOCVD technique.

\* \* \* \* \*